(12) United States Patent
Shimodaira

(10) Patent No.: US 6,730,546 B2
(45) Date of Patent: May 4, 2004

(54) MOLDED COMPONENT AND METHOD OF PRODUCING THE SAME

(75) Inventor: Kazuhiko Shimodaira, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 23 days.

(21) Appl. No.: 09/941,218

(22) Filed: Aug. 29, 2001

(65) Prior Publication Data

US 2002/0033555 A1 Mar. 21, 2002

(30) Foreign Application Priority Data

Sep. 1, 2000 (JP) .................................. 2000-265596
Sep. 1, 2000 (JP) .................................. 2000-265597
Sep. 1, 2000 (JP) .................................. 2000-265598
Sep. 1, 2000 (JP) .................................. 2000-265599

(51) Int. Cl.⁷ .............................................. H01L 21/50
(52) U.S. Cl. ................................... 438/123; 438/124
(58) Field of Search ............................. 257/666, 668, 257/669, 670, 676, 687; 438/123, 124

(56) References Cited

FOREIGN PATENT DOCUMENTS

JP 11-298279 * 10/1999 ............ H03H/9/02

* cited by examiner

*Primary Examiner*—Roy Potter
(74) *Attorney, Agent, or Firm*—Oliff & Berridge, PLC

(57) ABSTRACT

A molded component is produced by inserting an electronic component between lead frames disposed at two respective ends, and then molding the electronic component with resin. At least a lead frame disposed on one of the two ends serves as an electrode terminal exposed from a resin-molded part and the lead frame on the other end serves as a dummy terminal. The dummy terminal includes a horizontal part having an end portion exposed to the outside and extending horizontally from the resin-molded part, and also includes a rising-up part, which is formed integrally with the horizontal part, and which rises up from the inner end of the horizontal part. The angle between the rising-up part and the horizontal part is set to be slightly smaller than 90°. Thus, in the molded component and the production method thereof according to the present invention, an electronic component can be precisely positioned with respect to a terminal-forming lead frame, thereby ensuring that a good electrical connection is achieved, and the electronic component can be properly molded with resin, thereby forming a resin-molded part.

9 Claims, 21 Drawing Sheets

$\theta < 90°$ (A)  (B)

(A)  (B)

(A)　　　　　　(B)

(A)　　　　　　　　　　(B)

MOLDED COMPONENT AND METHOD OF PRODUCING THE SAME

BACKGROUND OF THE INVENTION

1. Field of Invention

The present invention relates to a resin-molded electronic component, and to a method of producing such a resin-molded electronic component.

2. Description of Related Art

In recent years, great reductions in the size and thickness have been achieved for various small-sized information devices, such as an HDD (hard disk drive), a mobile computer, and an IC card, and also for various mobile communication devices, such as a portable telephone, a mobile telephone, and a paging system. Correspondingly, enhancements in performance have been achieved for various electronic components, such as a piezoelectric resonator and a piezoelectric oscillator for use in information devices or communication devices, wherein, in many cases, these electronic components are produced into forms suitable for automatic mounting.

For example, in the case of a piezoelectric resonator of such electronic components, a quartz resonator chip serving as a piezoelectric material in the form of a very thin plate is disposed in a package. Such a quartz resonator chip includes metal electrode films formed in particular patterns and disposed on two opposite surfaces of the quartz plate. If a driving voltage is applied between the two electrode films, the quartz resonator chip vibrates at a specific vibration frequency depending upon the thickness of the quartz resonator chip. The vibration is converted into an electrical signal and used, as a clock signal, in a device in which the quartz resonator is disposed.

In such piezoelectric resonators, if a package in which a piezoelectric resonator chip is housed has a special shape, or if electrode terminals which are to be connected to a mounting board are formed at locations different from those of other types of electronic components, it is impossible to automatically mount piezoelectric resonators. To avoid the above problem, it is known to produce a molded component such that a package is molded with resin and electrode terminals are formed using lead frames so that the resultant molded component has a form suitable for automatic mounting using an automatic mounting machine.

When a piezoelectric resonator is produced into a molded form according to the conventional technique, electrode terminals must be formed so as to adapt to the external shape of a resin-molded part.

More specifically, in the case where an electronic component is produced in a resin-molded form, terminals must be formed so as to extend outwardly from a resin-molded part at locations precisely corresponding to lands of a conductive pattern formed on a mounting board.

To this end, before performing molding, an electronic component is precisely positioned with respect to a lead frame for forming a terminal (terminal-forming lead frame), and then lead terminals of the electronic component are connected to the terminal-forming lead frame. Thereafter, the electronic component connected with the lead frame is placed in a mold, and a molding material is injected into the mold thereby performing molding.

However, in many cases, electronic components, such as a piezoelectric resonator, are very small in size, and thus it is difficult to precisely position lead terminals of electronic components with respect to the terminal-forming lead frames. If the positioning is not precise enough, a good connection between lead terminals and a lead frame is not achieved, and thus a resultant product has degraded performance.

Furthermore, if an electronic component is not placed at a correct position in a mold, a problem not only occurs in forming electrode terminals, but also a problem occurs that the electronic component is not properly covered with a molding material and the electronic component is partially exposed from a resin-molded part.

The conventional molded component has another problem as described below.

FIG. 39 illustrates one production step of a conventional molded component. In this production method, an electronic component to be molded, that is, a piezoelectric resonator chip housed in a cylindrical package 511, is inserted between lead frames 513 and 514 disposed on a terminal-forming frame 521 and is properly positioned.

As shown in FIG. 39, the lead frame 513 formed on one end of the terminal-forming frame 521, which will become an electrode terminal of the molded component, includes a part 513a extending substantially horizontally from the terminal-forming frame 521, a rising-up part 513b formed integrally with the horizontal part 513a and extending substantially vertically from the inner end of the horizontal part 513a, and a lead terminal connection part 513c extending horizontally from the upper end of the rising-up part 513b.

On the other hand, a lead frame 514 formed on the other end of the terminal-forming frame 521 includes a rising-up part 514b formed on the inner end of the lead frame 514 and an outwardly extending part 514a which is integrally formed with the rising-up part 514b and which is connected to the terminal-forming frame 521. After completion of a resin-molding process, an end portion of the outwardly extending part 514a becomes a horizontal part extending horizontally from a resin-molded part and serving as a dummy terminal.

After inserting the packaged electronic component 511 between the lead frames 513 and 514 located on the two respective ends, the outer lead 512b of the package 511 and the connection part of the lead frame 513 are welded to each other, as shown in an enlarged fragmentary view of FIG. 40, by applying a voltage between an upper electrode 532 and a lower electrode 531 of an electrode block (not shown in FIG. 40).

In the above process, the outer lead 512b is put on the lead frame 513, and the lower electrode 531 is brought from below into contact with the lead frame 513, and the upper electrode 532 is brought from above into contact with the outer lead 512b. Thereafter, the voltage is applied between the upper electrode 532 and the lower electrode 531 while pressing the lead frame 513 and the outer lead 512b between the upper electrode 532 and the lower electrode 531.

However, because the lead terminal connection part 513c extends substantially vertically from the rising-up part 513b of the lead frame 513, a gap 513e is created when the lower electrode 531 comes into contact with a corner 513d at which the lead frame 513 is bent. If such a gap 513e is created, an applied current cannot flow sufficiently, and thus welding is not well performed.

After completion of the welding described above, the package 511 is sandwiched between an upper mold 534 and a lower mold 533 and a molding material is injected so as to mold the package 511 by transfer molding, as shown in FIG. 41. In this molding process, if horizontally extending parts of the lead frames 513a and 514a are slightly inclined upwardly in an inward direction, a gap 533a or 533b is created.

The creation of the gap 533a or 533b can cause a molding material to intrude into the gap 533a or 533b, and thus can cause a burr to be created on a surface serving as a mounting surface, which is to be contacted with a surface of a mounting board when being mounted, of the molded component. The burrs can result in an insufficient mounting strength when the molded component is mounted on the board, and thus can cause degradation of quality.

The conventional molded component has still another problem as described below.

FIG. 42(A) illustrates a process of producing a resin-molded part 515 by molding a package 511 with resin using a terminal-forming frame 521. A gate 535 for use in molding is formed near a dummy-terminal lead frame 514.

The lead frame 514 is formed integrally with the terminal-forming frame 521 made of metal such as a copper-based alloy.

More specifically, the terminal-forming frame 521 has a space 521a in the form of a rectangular window, which is larger than the size of the electronic component, and which is surrounded by a peripheral part 521b. In this space 521a, the above-described electronic component, such as a piezo-electric resonator chip, is placed between the above-described lead frame 514 and a lead frame (not shown) on the opposite end, and a resin-molded part 515 is produced using a molding material. Through the above process, a molded component 500 is obtained.

In the case where the electronic component is a piezo-electric resonator chip or a similar device, lead terminals are disposed on only one side. In this case, electrode terminals used to mount the molded component 500 are formed as follows. That is, the lead frame on the opposite end, which is not shown in FIGS. 42(A) and 42(B), is electrically connected to the lead terminal of the electronic component in the resin-molded part 515 so that the lead frame will become an electrode terminal. On the other hand, the lead frame 514, shown in FIGS. 42(A) and 43(B), will become a dummy terminal which will be used only to fix the molded component 500 on a board when the molded component 500 is mounted on the board.

In this case, the lead frame 514 is placed at a height substantially equal to the lower surface of the resin-molded part 515, and the horizontal part 514a in the form of a flat plate is exposed to the exterior of the resin-molded part 515. As shown in FIG. 42(B) which is a cross-sectional view taken along plane f—f of FIG. 42(A), the gate 535 interferes with the horizontal part 514a, in the form of the flat plate, of the lead frame 514, and thus, the gate 535 is formed at a height shifted upward by an amount equal to the thickness t of the horizontal part 514a. As a result, the distance between the upper end of the gate 513 and the upper end of the resin-molded part 515 is reduced to a small value denoted by "a".

The size of the piezoelectric resonator 500 is very small. For example, the total thickness of the resin-molded part 515 shown in FIG. 42(A) is about 1.3 mm. Thus, if the thickness from the upper end of the gate 535 shown in FIG. 42(B) to the upper end of the resin-molded part is as small as "a", there is a possibility that a crack is created in this portion when the gate is cut off. Such a crack results in degradation in the quality of the product.

The conventional molded component has still another problem which occurs during the molding process, as described below.

In the conventional molding process, as shown in FIG. 42, the packaged electronic component placed in the space 521a of the terminal-forming frame 521 is molded with a molding material, and thus the resin-molded part 515 is formed.

In this molding process, the peripheral part 521b of the terminal-forming frame 521 is placed between an upper mold 534 and a lower mold 533, as shown in FIG. 43. More specifically, as shown in FIG. 44, which is a cross-sectional view taken along plane d—d of FIG. 43, the package 511 is tightly held between a contact part 533a formed on the upper surface of the lower mold 533 and an eject pin 534a which can move up and down in the inside of the upper mold 534, and a molding material is injected into the mold so as to form the piezoelectric resonator 500 including the resin-molded part 515, as shown in FIG. 45.

The width of the molding resin of the resin-molded part 515 is denoted by "c" in FIG. 45. However, because the peripheral part 521b of the terminal-forming frame 521 is sandwiched between the upper mold 534 and the lower mold 533 as described above with reference to FIG. 44, burrs 515a and 515a are created in gaps between the upper mold 534 and the lower mold 533. This results in an unwanted increase in the total external size of the obtained piezoelectric resonator 500, as denoted by "b" in FIG. 45.

SUMMARY OF THE INVENTION

A first object of the present invention is to provide a molded component and a production method thereof, in which an electronic component is precisely positioned with respect to a terminal-forming lead frame, thereby ensuring that a good electrical connection is achieved and the electronic component is properly molded with resin, thereby forming a resin-molded part.

A second object of the present invention is to provide a method of producing a molded component, in which an electronic component is precisely positioned with respect to a terminal-forming lead frame, thereby ensuring that a good electrical connection is achieved and molding is performed without creating burrs on a mounting surface of a resultant molded component, thereby ensuring that a strong mounting connection is achieved.

A third object of the present invention is to provide a molded component and a production method thereof, in which a crack is prevented from being created when a gate is cut off after producing a resin-molded part using a molding material.

A fourth object of the present invention is to provide a resin-molded structure of a molded component and a method of producing such a structure, in which no burrs are created on a side face during the step of molding an electronic component, having a shape which is long in one direction, with a molding material, and thus a small resin-molded structure can be realized.

According to an aspect of the present invention, to achieve the first object described above, there is provided a molded component obtained by inserting an electronic component between lead frames disposed at two respective ends and then molding the electronic component with resin. In this molded component, at least a lead frame disposed on one end serves as an electrode terminal exposed from a resin-molded part and the lead frame on the other end serves as a dummy terminal. The dummy terminal includes a horizontal part having an end portion exposed to the exterior of the device and extending horizontally from the resin-molded part, and a rising-up part which is formed integrally with the horizontal part and which rises up from the inner end of the horizontal part. The angle between the rising-up part and the horizontal part is set to be slightly smaller than 90°.

In the molded component according to the present invention, two types of lead frames are provided, one of which is used to form the electrode terminal, and the other one is used to form the dummy terminal, which includes the horizontal part having an end portion exposed to the outside from the resin-molded part, and the rising-up part, which is located on the inner side of the horizontal part, that is, at a side of an end of the electronic component inserted between the two frames and which is formed integrally with the horizontal part such that the rising-up part rises up from the inner end of the horizontal part. The angle between the rising-up part and the horizontal part is set to be slightly smaller than 90°. Because the angle is set in the above-described manner, the rising-up part is inclined outwardly, that is, inclined apart from the electronic component. Therefore, when the electronic component is inserted from above into a space between the lead frames disposed on the two respective ends, the electronic component is guided by the outwardly-inclined surfaces, and thus the electronic component is precisely positioned without encountering interference between an edge of the rising-up part and an edge of the electronic component.

The first object described above is also achieved by a method of producing a molded component according to the present invention. In this method, a molded component is obtained by inserting an electronic component between lead frames disposed at two respective ends and then molding the electronic component with resin. The method includes the step of connecting a lead terminal to an electrode terminal by bringing the lead terminal of the electronic component into contact with at least one of lead frames disposed on the two respective ends, and then applying a voltage thereto so as to connect the lead terminal to the electrode terminal. The connection step includes the steps of positioning the lead frame with respect to an electrode block that supplies the voltage; and bringing the electronic component into contact with an electronic component holding device formed on the electrode block, thereby correctly positioning the lead terminal of the electronic component with respect to the one of lead frames disposed on the two respective ends.

In the method according to the present invention, the lead frame is positioned with respect to the electrode block that supplies the voltage, and the electronic component is brought into contact with the electronic component holding device formed on the electrode block, thereby ensuring that the electronic component, the lead frames, and the electrode block are all precisely positioned with respect to one another. This makes it possible to precisely position the lead terminal of the electronic component with respect to at least one of lead frames, and thus it becomes possible to properly connect the lead terminal to that lead frame. This ensures that a good electrical connection is achieved.

The first object described above is also achieved by a method of producing a molded component according to another aspect of the present invention. In this method, a molded component is obtained by inserting an electronic component between lead frames disposed at two respective ends and then molding the electronic component with resin. The method includes the step of molding the electronic component with resin after connecting a lead terminal to an electrode terminal by bringing the lead terminal of the electronic component into contact with at least one of lead frames disposed on the two respective ends, and then applying a voltage thereto so as to connect the lead terminal to the electrode terminal. A positioning device, having a contact surface which fits with the external shape of the electronic component, is disposed in a mold used in the molding step. Molding is performed while maintaining the positioning device in contact with the electronic component.

In the method according to the present invention, positioning of the lead terminal of the electronic component is not performed on the electronic component, and instead is performed in the mold, such that the positioning device, having a contact surface which fits with the external shape of the electronic component, is disposed in the mold used in the molding step, and molding is performed while maintaining the positioning device in contact with the electronic component. In this method, because the electronic component is fit with the contact surface of the positioning device in the mold and held by the positioning device, the electronic component does not deviate in a lateral direction, and thus the resultant molded electronic component does not have a part exposed from a side of the resin-molded part.

The first object described above is also achieved by another aspect of the invention, in which the positioning device includes a recessed part formed in the contact surface which fits with the electronic component, and molding is performed such that the recessed part is filled with the molding material.

In the invention, because the contact surface of the positioning device is formed so as to fit with the external shape of the electronic component, the molding material cannot easily enter between the electronic component and the contact surface during the molding process. To avoid the above problem, the recessed part is formed in the contact surface so that the molding material can enter into the recessed part, thereby ensuring that the side, in contact with the positioning device, of the electronic component is also covered with the molding material and thus the electronic component is entirely molded with resin.

The second object described above is achieved by a method of producing a molded component according to another aspect of the present invention. In this method, a molded component is obtained by inserting an electronic component between lead frames disposed at two respective ends, and then molding the electronic component with resin. A lead frame, disposed on one of the two ends of the electronic component, includes an outwardly extending part, a rising-up part which rises up from the inner end of the outwardly extending part, and a lead terminal connection part extending inwardly from the end of the rising-up part. The method includes the steps of, before molding the electronic component with resin, disposing the lead frame on one end, such that the lead terminal connection part thereof is slightly inclined downwardly in an inward direction; and thereafter, bringing an electrode that applies a welding voltage into contact with the lead terminal connection part from below, and then placing a lead terminal of the electronic component upon the lead terminal connection part, and finally connecting the lead terminal to the lead terminal connection part.

In the method according to the present invention, in a state in which one lead frame, which will become the electrode terminal is attached to the terminal-forming frame, at least the lead terminal connection part of the lead frame is inclined downwardly in the inward direction. Herein, the "inward direction" refers to a direction toward the electronic component.

In such a state, the lead of the electronic component is placed upon the lead terminal connection part of the terminal-forming frame, and they are sandwiched between a lower electrode and an upper electrode and a voltage is applied thereto to weld them to each other. During the above process, the lower electrode is brought from below into contact with a lower edge of the lead terminal connection part in the slightly inclined position, and the lead terminal connection part is pushed up by the lower electrode. As a result, the lead terminal connection part is changed into a horizontal position. Thus, the upper surface of the lower electrode and the lower surface of the lead terminal connection part extending horizontally are entirely in contact with each other without creating a gap between them, and thus the voltage can be properly applied thereto. This ensures that they are connected to each other in a highly reliable fashion.

In the molding process performed after completion of connection of the lead terminal, the electronic component is sandwiched between an upper mold and a lower mold. At this stage, the outwardly extending part is slightly inclined downward because the outwardly extending part is substantially parallel to the lead terminal connection part. However, when the lead terminal connection part is moved into a horizontal position, the outwardly extending part is also moved into a horizontal position, and thus no gap is created between the lower mold and the outwardly extending part. Therefore, no burrs are created on the lower surface of the molded component. The lower surface of the molded component is brought into contact with a surface of a board when the molded component is mounted thereon. Thus, the lower surface of the molded component can be directly contacted with a land formed on the board without any burrs. As a result, an enhancement in the strength of the mounting connection is achieved.

The second object described above is also achieved by another aspect of the invention. According to the invention, a lead frame disposed on the other one of the two ends of the electronic component includes an end part extending outwardly and a rising-up part, which is formed integrally with the outwardly extending part, and which rises up from the inner end of the outwardly extending part, and, before molding the electronic component with resin, the lead frame is disposed such that the outwardly extending part is slightly inclined downwardly in an inward direction.

In the invention, unlike the method previously described, because the other lead frame is not connected to the lead terminal, the other lead frame is not changed by the lower electrode. However, in the molding process, although the outwardly extending part of the other lead frame is slightly inclined downward in the inward direction, this outwardly extending part placed between the upper mold and the lower mold is pushed up by the lower mold, and thus the outwardly extending part is brought into a horizontal position. Therefore, no gap is created between the lower mold and the lead frame. Therefore, no burrs are created on the lower surface of the molded component. The lower surface of the molded component is brought into contact with a surface of a board when the molded component is mounted thereon. Thus, the lower surface of the molded component can be directly contacted with a land formed on the board without any burrs. As a result, an enhancement in the strength of mounting connection is achieved.

According to another aspect the present invention, a groove is formed in a surface, which is to be used as a contact surface when the molded component is mounted, of the lead frame disposed on one of the two ends, and the lead frame including the grooved part is plated with solder.

In the invention, because at least one of lead frames exposed from the resin-molded part of the molded component (the lead frame which becomes the electrode terminal) has a groove formed in a surface which is to be contacted with a board when being mounted, and because the grooved portion is also plated with solder, when the molded component is mounted on the board, the grooved surface, which is slightly away from the contact surface of the board, can also be wet with connection solder. Thus, the strength of mounting connection is enhanced, and an electrical connection is made in a more reliable fashion.

The third object described above is achieved by a molded component according to another aspect of the present invention. According to the invention, the molded component is obtained by inserting an electronic component between lead frames disposed at two respective ends, and then molding the electronic component with resin. The molded component is provided such that at least a lead frame disposed on one end serves as an electrode terminal exposed from a resin-molded part, and the lead frame on the other end serves as a dummy terminal. The dummy terminal includes a horizontal part having an end portion exposed to the exterior and extending horizontally from a part near a lower edge of the resin-molded part, and at least a part, exposed to the exterior from the resin-molded part, of the horizontal part is divided into two portions along a horizontal direction.

In the molded component according to the present invention, the part, exposed to the exterior from the resin-molded part, of the dummy terminal is divided into two portions along the horizontal direction. This allows a gate used for injection of a molding material to be formed in the mold, in a region between the two divided portions of the dummy terminal. Because no lead frame is present in the region between the divided portions of the dummy electrode, the gate can be formed at a lower height. That is, the location of the gate can be lowered by a value corresponding to the thickness of the lead frame. As a result, in the molded component having a very small size, the distance from the top of the gate to the top of the resin-molded part can be large enough to prevent a crack from being created in this upper part of the resin-molded part when the gate is cut off.

The third object described above is also achieved by a method of producing a molded component according to another aspect of the present invention. In this method, a molded component is obtained by inserting an electronic component between lead frames disposed at two respective ends, and then molding the electronic component with resin. The method is performed such that at least a lead frame disposed on one end serves as an electrode terminal exposed from a resin-molded part and the lead frame on the other end serves as a dummy terminal. The dummy terminal includes a horizontal part having an end portion exposed to the exterior and extending horizontally from a part near a lower edge of the resin-molded part. At least a part, exposed to the outside from the resin-molded part, of the horizontal part is divided into two portions along a horizontal direction. In the resin molding step, a gate for passing a molding material is formed in a region between the two divided portions of the dummy terminal.

In the method according to the present invention, as in the aspect of the invention discussed above, the part, exposed to the outside from the resin-molded part, of the dummy terminal is divided into two portions along the horizontal direction. Thus, for the same reason as discussed above, if the gate used for injection of the molding material is formed in the region between the two divided portions of the dummy terminal, the distance from the top of the gate to the top of the resin-molded part can be large enough to prevent a crack from being created in this upper part of the resin-molded part when the gate is cut off.

The fourth object described above is achieved by a resin-molded structure of a molded component according to another aspect of the present invention. The resin-molded structure is obtained by inserting an electronic component between lead frames disposed at two respective ends, and then molding the electronic component with resin. The structure is provided such that the lead frames are disposed such that they project inwardly from a peripheral part formed so as to surround the electronic component, and a gap is formed between a side surface of the electronic component and the peripheral part in a state in which the electronic component is connected to the lead frames so that a mold used in the resin-molding process is allowed to enter into the gap.

In the resin-molded structure according to the present invention, the lead frames are disposed such that they project inwardly from the peripheral part formed so as to surround the electronic component, and a large gap is formed between a side surface of the electronic component and the peripheral part in a state in which the electronic component is connected to the lead frames so that the entire contact surface of the upper mold and the entire contact surface of the lower mold can be located within the gap between the peripheral part and the side of the electronic component. Thus, it becomes possible to prevent burrs from being created on a side of the electronic component which would otherwise be created due to imperfect contact between the facing surfaces of the upper and lower molds. This allows a reduction in the total external size of the molded component.

The fourth object described above is also achieved by a method of producing a molded component according to another aspect of the present invention. In this method, a molded component is obtained by inserting an electronic component between lead frames disposed at two respective ends and then molding the electronic component with resin. The method is performed such that the resin molding step includes the steps of preparing a terminal-forming frame, including a peripheral part surrounding the electronic component, and also including the lead frames which are formed such that they project inwardly from the peripheral part. A gap is formed between a side surface of the electronic component and the peripheral part in a state in which the electronic component is connected to the lead frames so that a mold used in a resin-molding process is allowed to enter into the gap. The electronic component is molded after placing the mold such that contact surfaces of mold elements are located between the side surface of the electronic component and the peripheral part.

In the method according to the present invention, because the terminal-forming frame has the gap which is formed between a side surface of the electronic component and the peripheral part so that a mold used in a resin-molding process is allowed to enter into the gap, the entire contact surface of the upper mold, and the entire contact surface of the lower mold, can be located within the gap between the peripheral part and the side of the electronic component. Thus, for the same reason as previously discussed, it becomes possible to prevent burrs from being created on a side of the electronic component which would otherwise be created due to imperfect contact between the facing surfaces of the upper and lower molds. This allows a reduction in the total external size of the molded component.

BRIEF DESCRIPTION OF THE DRAWINGS

FIGS. 6(A) and 6(B) show a process of connecting an outer lead to a lead frame according to a conventional technique, wherein FIG. 6(A) is a perspective view and FIG. 6(B) is a front view;

FIGS. 24(A) and 24(B) show the location of a gate used in the molding process according to the embodiment of the present invention, wherein FIG. 24(A) is a fragmentary perspective view illustrating parts in the vicinity of a lead frame 14, and FIG. 24(B) is a fragmentary cross-sectional view illustrating the parts in the vicinity of the lead frame 14;

FIGS. 29(A) and 29(B) show a manner in which the conventional molded component is mounted, wherein FIG. 29(A) is a cross-sectional view, and FIG. 29(B) is an enlarged fragmentary view;

FIGS. 36(A) and 36(B) show a manner in which a molded component according to an embodiment of the present invention is mounted, wherein FIG. 36(A) is a cross-sectional view, and FIG. 36(B) is an enlarged fragmentary view;

FIGS. 42(A) and 42(B) show the location of a gate used in a molding process according to a conventional technique, wherein FIG. 42(A) is a fragmentary perspective view illustrating parts in the vicinity of a lead frame 114, and FIG. 42(B) is a fragmentary cross-sectional view illustrating the parts in the vicinity of the lead frame 114;

DETAILED DESCRIPTION OF PREFERRED EMBODIMENTS

Preferable embodiments of the present invention are described below with reference to the drawings.

Figure 1:
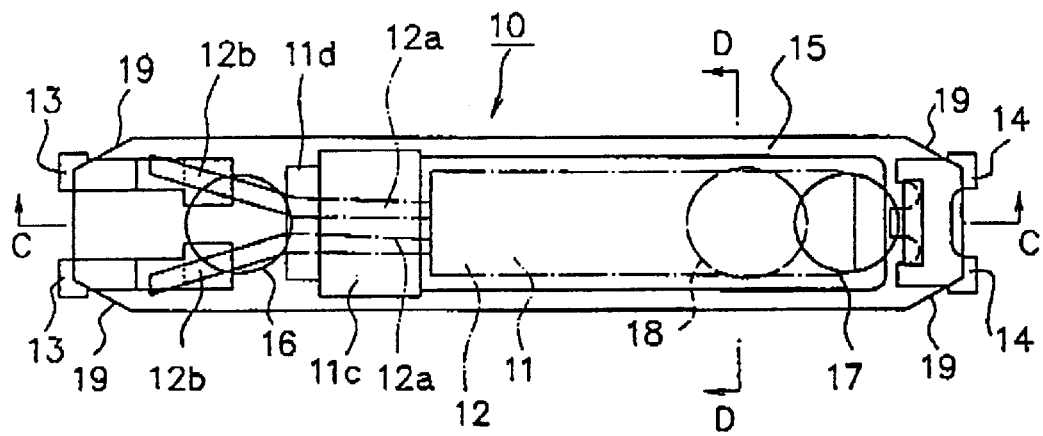
FIG. 1 is plan view of a piezoelectric resonator in the form of a molded component according to an embodiment of the present invention.
Figure 2:
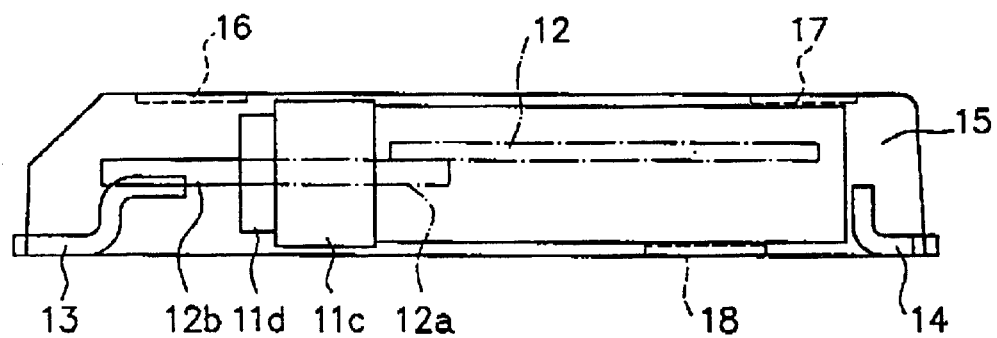
FIG. 2 is a cross-sectional view of the piezoelectric resonator taken along plane C—C of FIG. 1.
Figure 3:
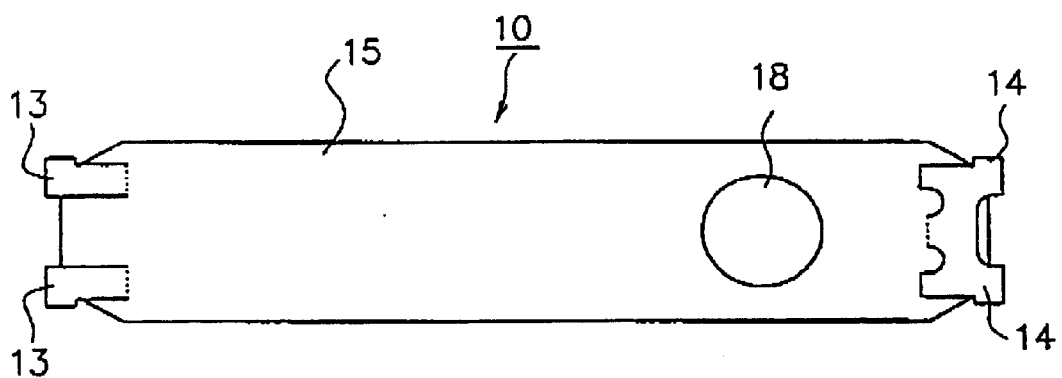
FIG. 3 is a bottom view of the piezoelectric resonator shown in FIG. 1.
Figure 4:
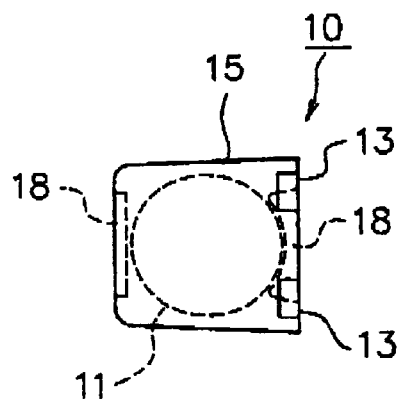
FIG. 4 is a cross-sectional view of the piezoelectric resonator taken along plane D—D of FIG. 1.

FIGS. 1 to 4 illustrate the structure of a piezoelectric resonator in the form of a molded component according to an embodiment of the present invention, wherein FIG. 1 is a plan view of the piezoelectric resonator according to the embodiment, FIG. 2 is a cross-sectional view taken along plane C—C of FIG. 1, FIG. 3 is a bottom view of the piezoelectric resonator shown in FIG. 1, and FIG. 4 is a cross-sectional view taken along plane D—D of FIG. 1.

To facilitate the understanding of the internal structure, FIGS. 1 and 2 are drawn as if molding resin were transparent.

In FIGS. 1 and 2, a piezoelectric resonator 10 includes a package 11 referred to as a quartz tube. The package 11 is formed of metal in a cylinder shape, one end of which is closed. The other end is open, and an expanded-diameter portion 11c is formed on the open end. A piezoelectric resonator chip 12 connected to an inner lead is housed in the package. As for the piezoelectric material of the piezoelectric resonator chip 12, for example, a thin quartz chip is used which vibrates at a particular frequency when a driving voltage is applied thereto. Electrodes used to apply the driving voltage to the quartz chip so as to vibrate the quartz chip are formed on the surfaces thereof. Instead of quartz, another type of piezoelectric material, such as $LiTaO_3$ or $LiNbO_3$, may also be employed as the piezoelectric material for the piezoelectric resonator chip 12.

The inner leads 12a connected to the driving electrodes of the quartz resonator chip 12 extend, as outer leads 12b and 12b, to the outside via a plug 11d made of an insulating material fit in the expanded-diameter part 11c of the package 11, and the inner leads 12a are connected to electrode terminals 13 and 13 exposed to the outside of the package 11. The electrode terminals 13 and 13 are exposed to the outside from one end of a resin-molded part 15.

That is, elements including the package 11 in which the quartz resonator chip 12 is housed and the outer leads 12b and 12b are molded with a particular molding material, such as an epoxy resin, as will be described below, so as to obtain a molded component.

To expose the electrode terminals 13 and 13 from one end of the resin-molded part 15, one end of each of the electrode terminals 13 and 13 are electrically connected, in the inside of the resin-molded part 15, to the corresponding one of the outer leads 12b and 12b, and each of the electrode terminals 13 and 13 is bent into the form of a crank, as shown in FIG. 2, so that the electrode terminals 13 and 13 are exposed at the bottom face of the resin-molded part 15, as shown in FIG. 3.

On the opposite end of the resin-molded part 15, dummy terminals 14 and 14, which are not connected to the quartz resonator chip 12, are formed by means of insert molding such that the dummy terminals 14 and 14 are exposed to the outside from the opposite end of the resin-molded part 15.

Corners of the resin-molded part 15 are formed so as to have tapered diagonal surfaces 19 and 19 so that the electrode terminals 13 and 13 are exposed from the diagonal surfaces. The corners on the opposite side of the lead frame 14 are also formed in a similar manner.

Furthermore, as shown in FIGS. 1 and 2, at locations near right and left ends of the piezoelectric resonator 10, recesses 16 and 17 are formed as a result of the presence of eject pins when the resin-molded part 15 is produced. Furthermore, on the lower surface (bottom surface) of the piezoelectric resonator 10, a recess 18 for use to position the package 11 is formed at an inward location with respect to the locations of the recesses 17. These recesses will be described in further detail later together with the molding process.

Because the piezoelectric resonator 10 is produced into the form of a molded component, including the molded part 15 obtained by molding the package 11 in which the piezoelectric resonator chip 12 is housed, it is possible to mount the piezoelectric resonator 10 in an automated fashion using an automatic mounting machine in a similar manner to other types of molded components, such as a semiconductor component. The electrode terminals 13 and 13 and the dummy terminals 14 and 14 are placed on corresponding lands (not shown) formed on the mounting board and fixed thereto by means of soldering so that a driving voltage can be applied to the quartz resonator chip 12 via the board disposed in a particular device, the electrode terminals 13 and 13, the outer lead 12b, and the inner lead 12a, and thus the quartz resonator chip 12 vibrates at a particular frequency. An electrical signal corresponding to the vibration is output and used as a clock signal in the device in which the piezoelectric resonator 10 is disposed.

Method of Producing the Piezoelectric Resonator

A method of producing the piezoelectric resonator 10 is described below.

Figure 5:
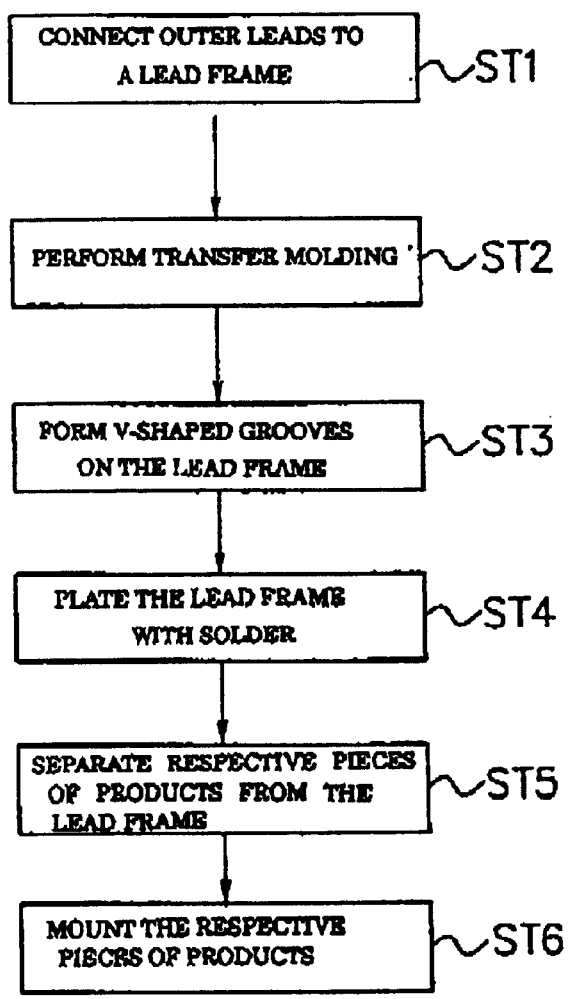
FIG. 5 is a flow chart illustrating, in a simplified fashion, a process of producing the piezoelectric resonator shown in FIG. 1.
Figure 6:
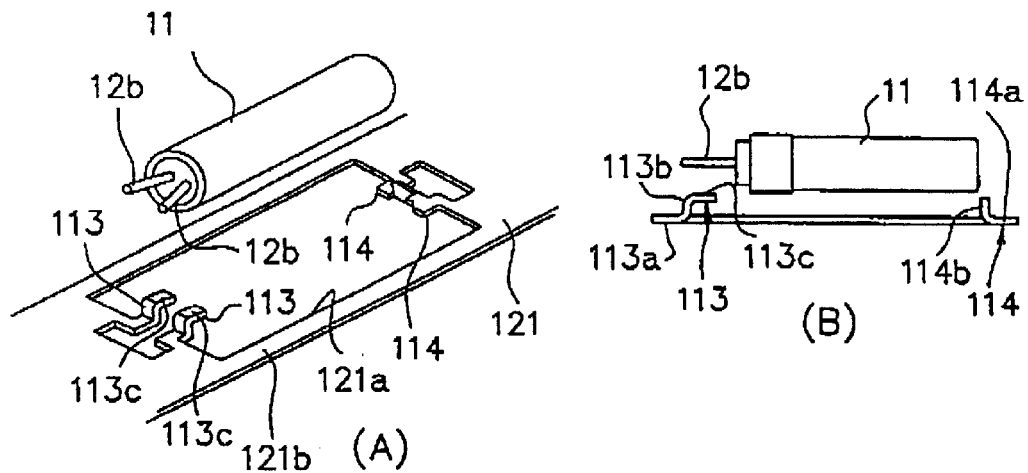

FIG. 5 is a flow chart illustrating the outline of the method of producing the piezoelectric resonator 10. First, the outline of the production steps is described below with reference to FIG. 5.

A particular piezoelectric material, such as a quartz wafer, is polished and cut into quartz chips which will be respectively formed into final products. Electrode films required for operation as a resonator chip, are formed on the upper and lower surfaces of each quartz chip, thereby forming a piezoelectric resonator chip 12. Thereafter, the piezoelectric resonator chip is sealed within a package 11, and outer leads 12b and 12b are connected to lead frames which will become electrode terminals 13 and 13 (ST1).

Thereafter, the package 11 is resin-molded using a particular molding material (ST2), thereby forming a resin-molded part 15.

Furthermore, after forming grooves in lead frames, which will become electrode terminals 13 and 13 and dummy terminals 14 and 14 (ST3), the lead frames are plated with solder (ST4).

Thereafter, individual molded components held by the lead frames are separated (ST5), and the completed products are mounted on a board by soldering (ST6).

Each of the production steps is described in further detail below.

Connection of Outer Leads to a Lead Frame (ST1)

FIGS. 6(A) to 17 illustrate steps of connecting outer leads 12b and 12b of a quartz resonator in which a piezoelectric resonator chip 12 is disposed, which is also called a cylinder-type quartz resonator, to lead frames which will become electrode terminals 13 and 13.

To facilitate the understanding of the present embodiment, a conventional production process is described first. As shown in a perspective view of FIG. 6(A) and a side view of FIG. 6(B), a terminal-forming frame 121 has a frame structure in which a plurality of spaces 121a in the form of partitioned rectangular windows each having a grater size than the size of the package 11 are arranged in two directions perpendicular to each other, as shown in the perspective view of FIG. 7.

Lead frames 113 and 114 are formed at two respective ends, in a longitudinal direction, of each space 121a such that the lead frames 113 and 114 extend inwardly into the corresponding space 121a. At least on one end, there are two similar lead frames (lead frames 113 and 113 in this specific example) extending in parallel with each other and inwardly into the corresponding space 121a. The lead frames 113 and 113 on that one end will become electrodes of the piezoelectric resonator. On the other hand, the lead frame 114 will become a dummy terminal.

As shown in FIG. 6(B), each lead frame 113, which will become an electrode terminal, includes a part 113a extending substantially horizontally from the space 121a of the terminal-forming frame 121, a rising-up part 113b formed integrally with the horizontal part 113a and extending substantially vertically from the inner end of the horizontal part 113a, and a lead terminal connection part 113c extending horizontally from the upper end of the rising-up part 113b.

The lead frame 114 includes a rising-up part 114b formed on the inner end of the lead frame 114 and an outwardly extending part 114a, which is integrally formed with the rising-up part 114b, and which is connected to the terminal-forming frame 121. After completion of a resin-molding process, an end portion of the outwardly extending part 114a becomes a horizontal part extending horizontally from a resin-molded part and serving as a dummy terminal.

In the connecting step, the packaged electronic component 11 is placed at a correct position between the lead frames 113 and 114, and the outer leads 12b and 12b, serving as the lead terminals of the package 11, are placed on the corresponding lead terminal connection parts 113c and 113c of the respective lead frames 113 and 113. Thereafter, the outer leads 12b and 12b and the lead terminal connection parts 113c and 113c are sandwiched between electrodes and welded to each other by applying a voltage thereto, as will be described below.

Figure 7:
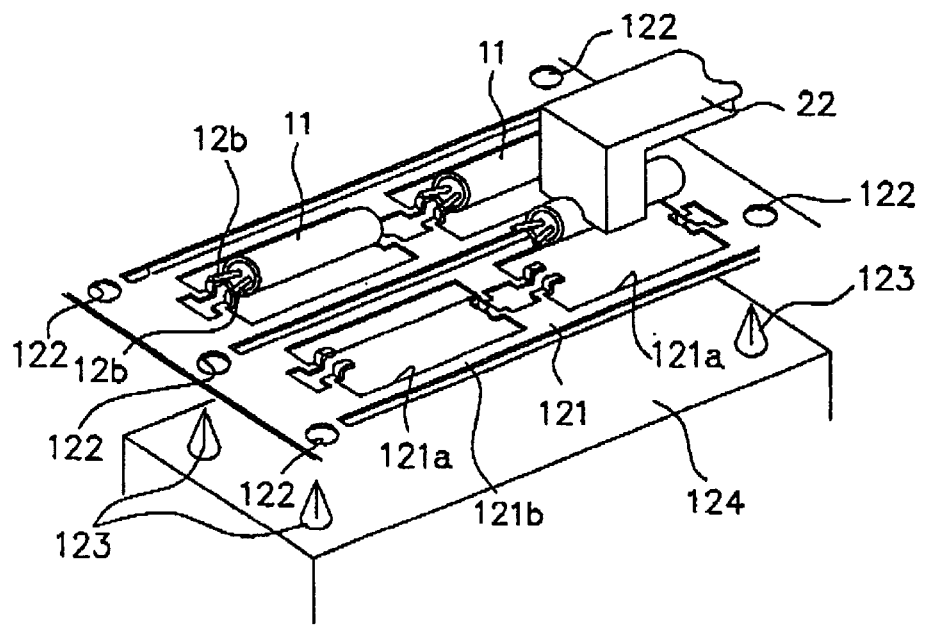
FIG. 7 is an exploded perspective view illustrating a process of connecting an outer lead to a lead frame according to the conventional technique.

As shown in FIG. 7, the terminal-forming frame 121 has positioning through-holes 122 formed at regular intervals along each of two opposite edges, so that the terminal-forming frame 121 can be positioned with respect to an electrode block 124, which is placed under the terminal-forming frame 121, and which is used to supply a driving voltage to weld the lead frames. The electrode block 124 has electrodes although they are not shown in FIG. 7.

Furthermore, the electrode block 124 has vertically-extending positioning pins 123 disposed, at regularly-spaced locations corresponding to the positioning through-holes 122 of the terminal-forming frame 121, along both edges of the electrode block 124. If the positioning pins 123 are inserted through the positioning through-holes 122 of the terminal-forming frame 121, the electrode block 124 and the terminal-forming frame 121 are positioned relative to each other.

A package 11 is then transported into a space 121a surrounded by a peripheral part 121b of the terminal-forming frame 121 by a transport jig 22, which has a curved surface corresponding to the circumferential side face of the cylindrical package 11, and which is capable of holding the package 11 by, for example, suction. Thereafter, welding is performed as described above with reference to FIG. 6(B).

Figure 8:
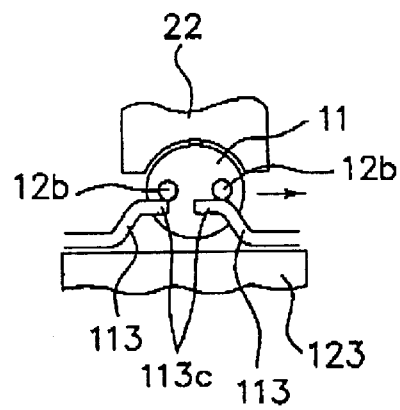
FIG. 8 is an enlarged fragmentary view of FIG. 7 illustrating the connection process.

However, in this technique, although the electrode block 124 can be positioned with respect to the lead frames 113 and 113, the electrode block 124 and the lead frames 113 and 113 are not precisely positioned with respect to packages 11, and there is a possibility that the position of a package 11 deviates in a direction denoted by an arrow in FIG. 8. Such a deviation results in a positioning error of the outer leads 12b and 12b serving as the lead terminals of the package 11 with respect to the positions of the corresponding lead terminal connection parts 113c and 113c, and thus it becomes impossible to correctly connect them with one another.

To avoid the above problem, in the present embodiment, positioning among the electrode block 124, the lead frames 113 and 113, and the package 11 is performed using a technique described below with reference to FIGS. 9 and 10.

Figure 9:
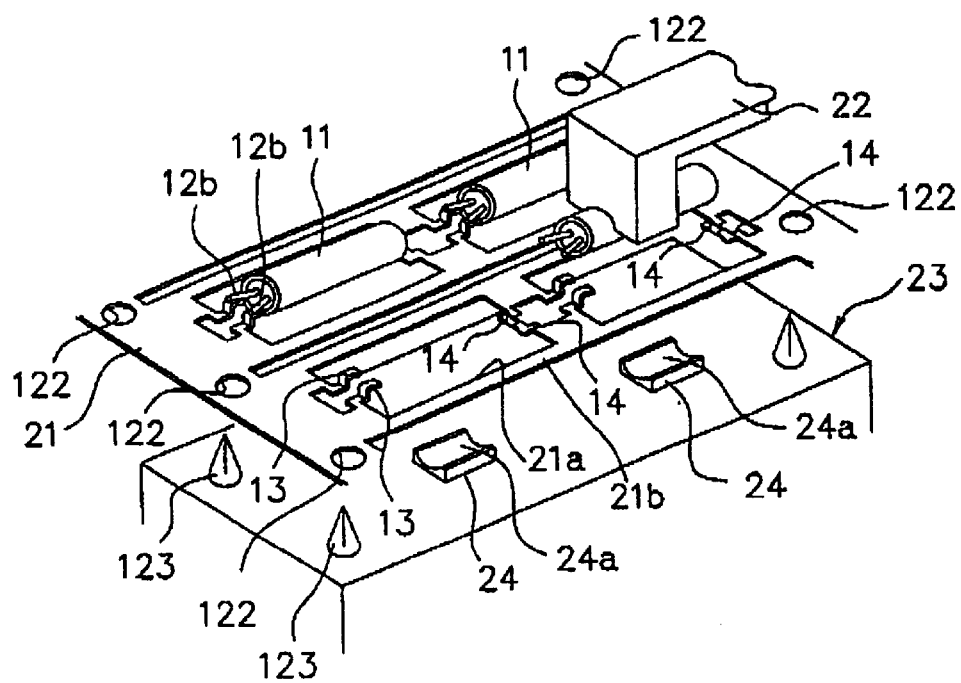
FIG. 9 is an exploded perspective view illustrating a process of connecting an outer lead to a lead frame according to an embodiment of the present invention.
Figure 10:
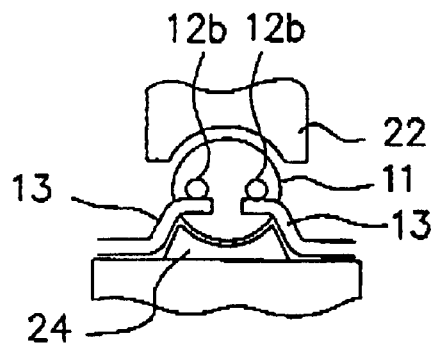
FIG. 10 is an enlarged fragmentary view of FIG. 9 illustrating the connection process.

FIG. 9 illustrates a connection technique according to the present embodiment of the invention. A terminal-forming frame 21 has a frame structure in which spaces 21a in the form of rectangular windows each having a grater size than the size of the package 11 are partitioned by peripheral portion 21b, and the spaces 21a are arranged in two directions perpendicular to each other.

Lead frames 13 and 14 are formed at two respective ends, in a longitudinal direction, of each space 21a such that the lead frames 13 and 14 extend inwardly into the corresponding space 21a. At least on one end, there are two similar lead frames 13 and 13 extending in parallel with each other and inwardly into the corresponding space 21a. The lead frames 13 and 13 on that end will become electrodes of the piezoelectric resonator. On the other hand, the lead frame 14 will become a dummy terminal.

As shown in FIG. 9, the terminal-forming frame 21 has positioning through-holes 122 formed at regular intervals along each of two opposite edges, so that the terminal-forming frame 21 can be positioned with respect to an electrode block 23, which is placed under the terminal-forming frame 21, and which is used to supply a driving voltage to weld the lead frames. The electrode block 23 has electrodes, although they are not shown in FIG. 9.

Furthermore, the electrode block 23 has vertically-extending positioning pins 123, which serve as a terminal-forming frame positioning device, and which are disposed, at predetermined-spaced locations corresponding to the positioning through-holes 122 of the terminal-forming frame 21, along both edges of the electrode block 124. If the positioning pins 123 are inserted through the positioning through-holes 122 of the terminal-forming frame 21, the electrode block 23 and the terminal-forming frame 21 are positioned with respect to each other.

Until this step, the process is performed in the same manner as in the conventional connection technique. However, the difference is that the electrode block 23 has an electronic component holding device 24 formed on the upper surface of the electrode block 23. Each electronic component holding device 24 has a shape which fits with the shape of a corresponding electronic component, so that each electronic component holding device 24 serves as an electronic component positioning device. Thus, the electrode block 23 according to the present embodiment has the device to position the terminal-forming frame 21 and the device to position the package 11. More specifically, each electronic component holding device 24 is produced by forming a protrusion on the upper surface of the electrode block 23 such that the upper surface 24a of the protrusion has an inwardly curved surface, which fits with the circumferential surface of the cylindrical package 11. Thus, as shown in FIG. 9, the electrode block 23 and the lead frames 13 and 13 can be positioned with respect to each other. Besides, when a package 11 is placed on the upper surface 24a of the electronic component holding device 24, the package 11 is precisely positioned as shown in FIG. 10 without encountering a deviation in a lateral direction.

Figure 11:
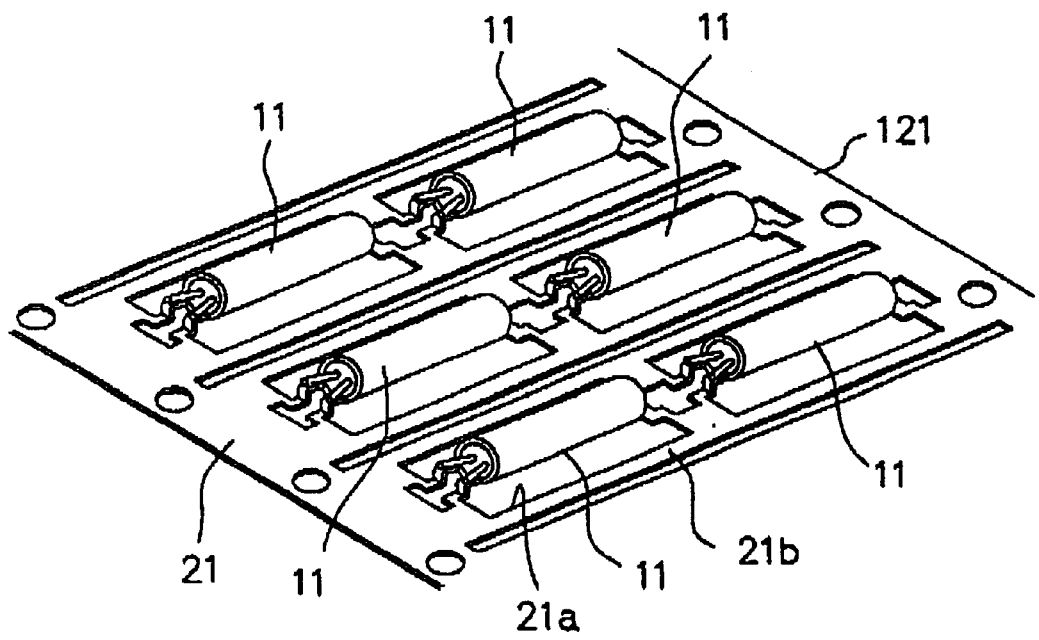
FIG. 11 is a perspective view illustrating a manner in which outer leads are connected to terminal-forming frames via the process of connecting the outer leads to the lead frames according to the embodiment of the present invention.

That is, as shown in FIG. 11, a plurality of packages 11 can be easily positioned with respect to the terminal-forming frame 21 by simply transporting each package 11 into a corresponding space 21a surrounded by the peripheral part 21b of the terminal-forming frame 21, using a transport jig 22, which has a curved surface corresponding to the circumferential side face of the cylindrical package 11, and which is capable of holding the package 11 by, for example, suction.

However, the connection process described above has the following problem.

Figure 12:
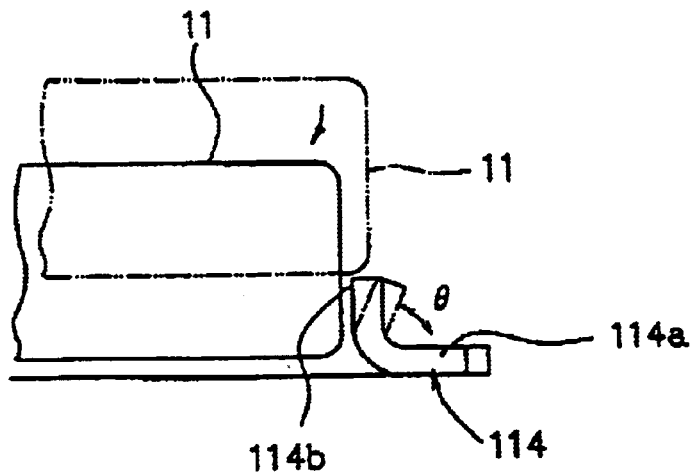
FIG. 12 is an enlarged fragmentary view illustrating a manner in which a package is inserted between lead frames in a conventional production process.

In the case where the rising-up part 114b of the dummy-terminal lead frame 114 rises up vertically, as shown by a solid line in an enlarged view of FIG. 12, when the packaged electronic component 11 is inserted between the lead frames 113 and 114, if the position of the package 11 is slightly deviated in a longitudinal direction, an end of the package 11 comes into contact with the rising-up part 114b of the dummy-terminal lead frame 114. This can make it impossible to insert the packaged electronic component 11 between the lead frames 113 and 114.

When the production process is performed in an automated manner using the transport jig 22, if such a deviation occurs, it becomes impossible to perform the following production steps.

Figure 13:
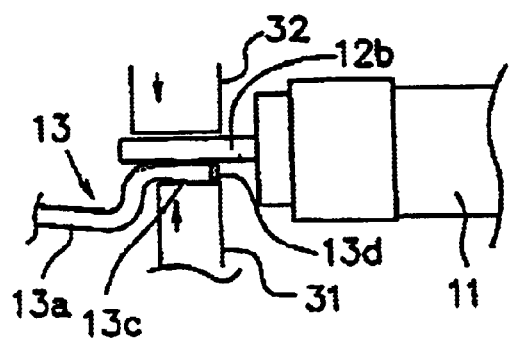
FIG. 13 is an enlarged fragmentary view illustrating a process of connecting an outer lead to a lead frame according to an embodiment of the present invention.

According to an embodiment of the present invention, the above problem is avoided by forming the electrode-terminal lead frame, as shown in FIG. 13.

That is, as shown in FIG. 13, the part, which will become an electrode terminal, of the lead frame 13 is formed such that when attached to the terminal-forming frame 21 (FIG. 9), at least the lead terminal connection part 13c is inclined downwardly in a direction to right in FIG. 13, that is, in the inward direction. In the case where the lead terminal connection part 13c of the lead frame 13 and the part 13a extending substantially horizontally into the space 21a of the terminal-forming frame 21 are parallel to each other, both the lead terminal connection part 13c and the horizontally-extending part 13a are formed so as to be inclined downwardly in the inward direction.

Figure 40:
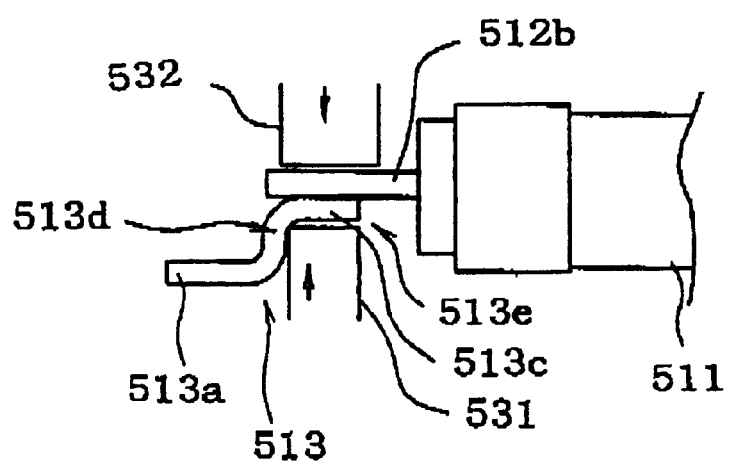
FIG. 40 is an enlarged fragmentary view illustrating a manner in which an outer lead and a lead frame are connected to each other in a production process according to a conventional technique.

Thus, as shown in FIG. 13, when the lower electrode 31 is brought into contact with the lower edge 13d of the end of the lead terminal contact part 13c and the upper electrode 32 is brought from above into contact with the outer lead 12b, and when a pressure is applied thereto, the lead frame 13 is remedied into a horizontal position, as shown by a broken line, and thus the upper surface of the lower electrode 31 is entirely brought into contact with the lower surface of the lead terminal contact part 13c without creating a gap, such as that shown in FIG. 40. Thus, a voltage is correctly applied to the outer lead 12b and the lead terminal contact part 13c, thereby ensuring that they are welded to each other in a highly reliable fashion.

Figure 14:
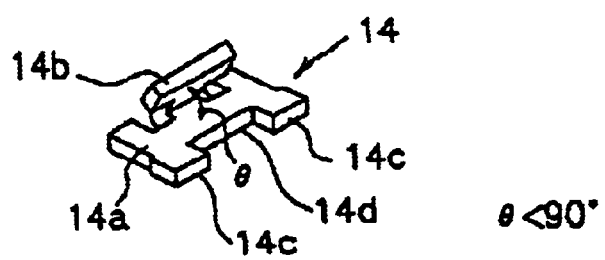
FIG. 14 is a fragmentary perspective view illustrating the structure of a lead frame 14 according to an embodiment of the present invention.

Furthermore, in the present embodiment, as shown in FIG. 14, the angle θ between the horizontal part 14a of the lead frame 14 which will become the dummy terminal and the rising-up part 14b thereof is set to be smaller than 90°.

This allows the package 11 to be easily inserted without encountering interference with the edge, as shown by a solid line in FIG. 12.

In FIG. 14, to facilitate the understanding of the structure of the lead frame 14, only the lead frame 14 is shown although the lead frame 12 is actually attached to the terminal-forming frame 21. The horizontal part 14a of the lead frame 14 has two portions 14c and 14c which extend outwardly and which are separated from each other by a cutout 14d. These two portions 14c and 14c will be exposed from the resin-molded part, as will be described below.

Figure 15:
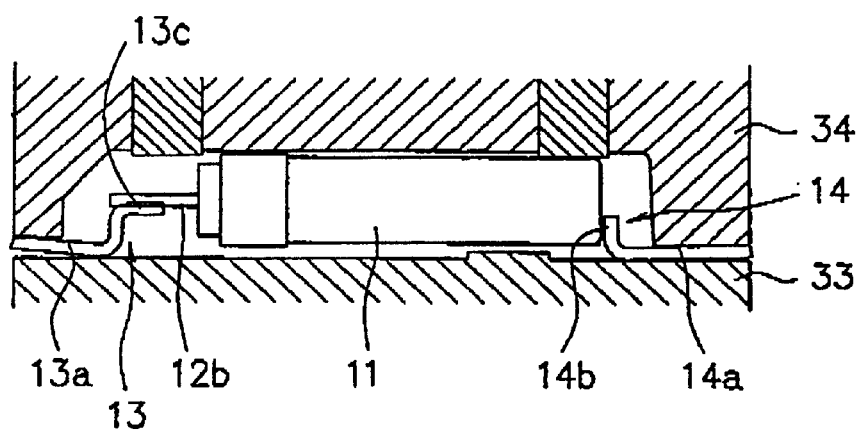
FIG. 15 is a cross-sectional view illustrating a piezoelectric resonator which has been placed in a mold after connecting an outer lead to a lead frame, in a molding process according to an embodiment of the present invention.

Thus, as shown in FIG. 15, in the molding process described below, at a processing stage at which the package 11 is placed between the upper mold 34 and the lower mold 33 but the upper mold 34 and the lower mold 33 have not yet been combined together into a closed state by moving them against each other, the parts extending substantially horizontally of the lead frames 13 and 14 are slightly inclined downward in an inward direction.

Figure 16:
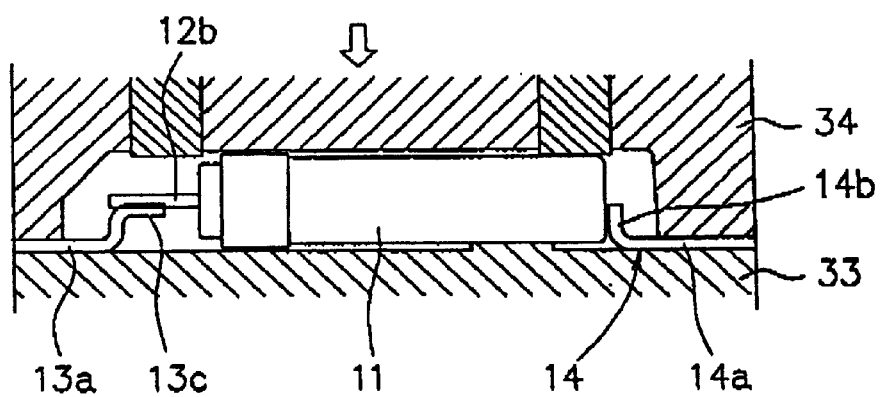
FIG. 16 is a cross-sectional view illustrating the piezoelectric resonator which has been placed in the mold after connecting the outer lead to a lead frame, wherein the mold has been closed after placing the piezoelectric resonator therein, in the molding process according to the embodiment of the present invention.
Figure 41:
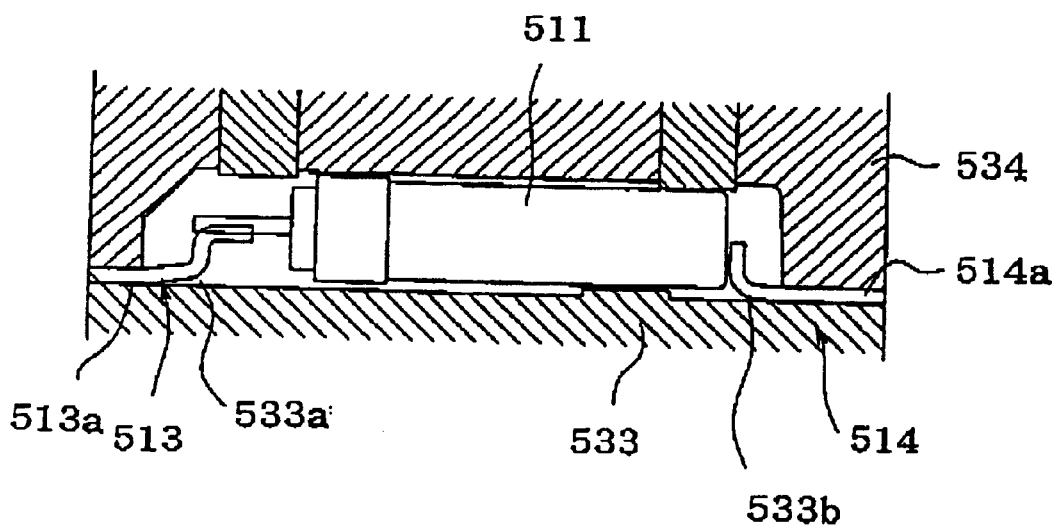
FIG. 41 is a cross-sectional view illustrating a package which has been placed in a mold after connecting an outer lead to a lead frame, in a molding process according to a conventional technique.

When the upper mold 34 and the lower mold 33 are combined together into a closed state, as shown in FIG. 16, the portions 13a and 14a are changed into horizontal positions. If, under such a condition, a molding material is injected into the mold, the portions 13a and 14a are slightly inclined and no gaps are created, unlike the case described above with reference to FIG. 41. Therefore, no burrs are created which would otherwise be created by the molding material intruding into gaps, and thus no degradation of the product quality occurs.

Figure 17:
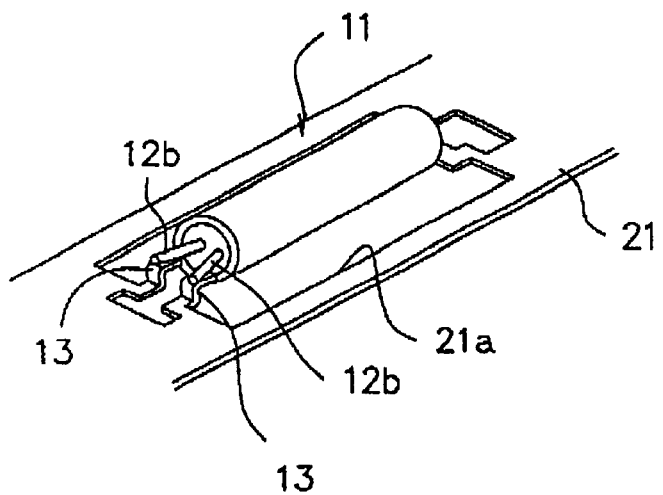
FIG. 17 is a perspective view illustrating a manner in which a package is connected to lead frames according to an embodiment of the present invention.

Thus, as shown in FIG. 17, the packaged electronic component 11 is inserted at a precisely positioned location between the lead frames 13 and 14 formed on the terminal-forming frame 21, and the outer leads 12b are precisely connected to the lead frames 13.

Forming the Resin-Molded Part 15 (ST2)

Figure 18:
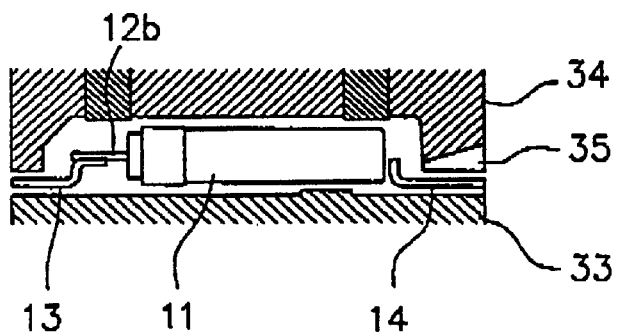
FIG. 18 is a cross-sectional view illustrating a package connected to lead frames and placed in a mold, in a molding process according to an embodiment of the present invention, wherein the location of a gate is shown.
Figure 19:
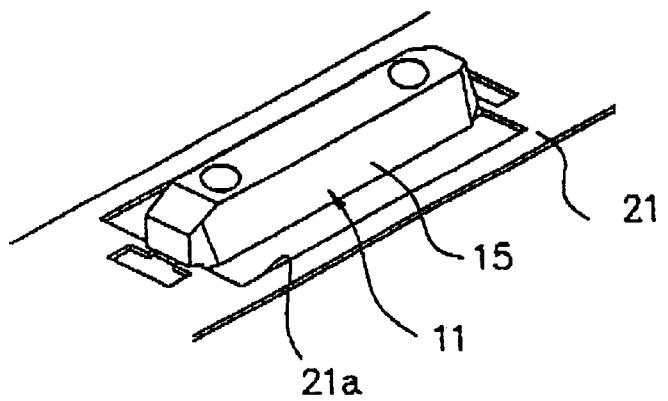
FIG. 19 is a perspective view illustrating a resin-molded component produced via a molding process according to the embodiment of the present invention.

Now, the process is described of forming the resin-molded part 15, as shown in FIG. 19, by injecting a molding material through the gate 15 after enclosing the package 11 between the upper mold 34 and the lower mold 33, as shown in FIG. 18.

Figure 43:
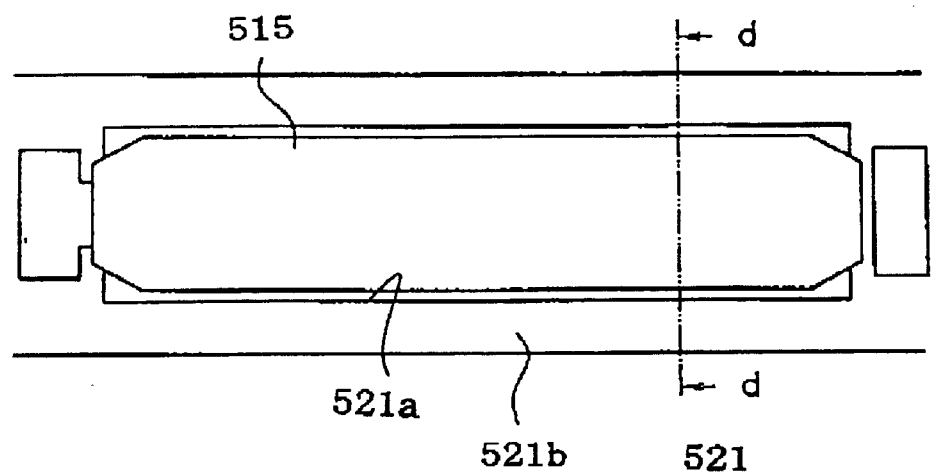
FIG. 43 is a plan view illustrating the relationship between a resin-molded part and a terminal-forming frame used in a production process according to a conventional technique.

In the present embodiment, as will be described below, not only the formation of burrs is prevented which occurs during the convention molding process, as described above with reference to FIGS. 43, 44, and 45, but also another problem in the conventional molding process shown in FIG. 44 is prevented.

Figure 44:
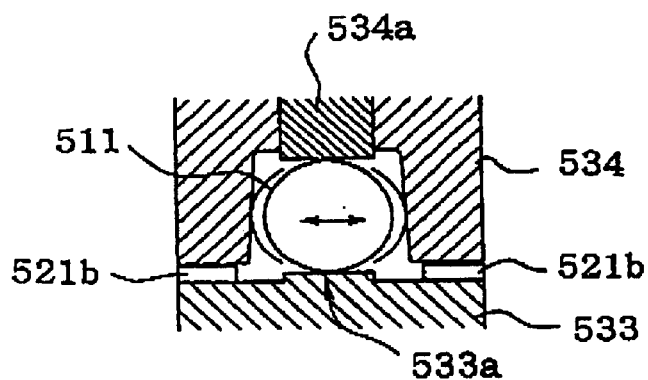
FIG. 44 is a cross-sectional view taken along plane d—d of FIG. 43.
Figure 45:
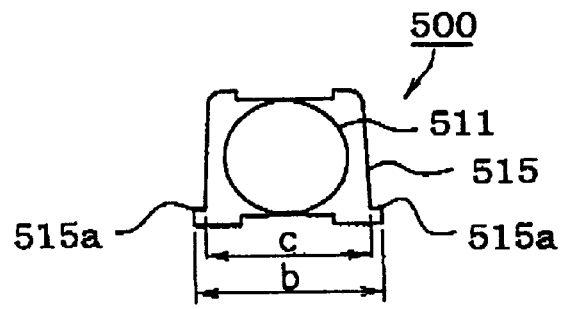
FIG. 45 is a cross-sectional view illustrating a piezoelectric resonator formed via a production process according to a conventional production process.

That is, in FIG. 44, the package 11 is held in the mold by simply being sandwiched between the contact part 133a formed on the upper surface of the lower mold 133 and the eject pin 134a which moves up and down in the inside of the upper mold 134. Therefore, the package 11 cannot be held in a perfect manner at a precisely positioned location. That is, a positioning error can occur. If a large positioning error occurs in a direction denoted by an arrow in FIG. 44, the package 11 is partially exposed at one side of the resin-molded part 115.

Another problem is that the presence of the contact part 133a, which is in contact with a lower part of the package 11, can cause the lower part of the package 11 to be imperfectly covered with the molding material. In this case, the lower part of the package 11 is exposed, and thus the package 11 can undesirably come into contact with a circuit pattern formed on a board.

Furthermore, if the package 11 is pressed from above and below by the eject pin 134a and the contact part 133a at the corresponding upper and lower locations, a stress is concentrated upon one point of the package 11, and thus the package 11 is deformed.

In an embodiment of the present invention, to avoid the above problems, molding is performed in the following manner.

Figure 20:
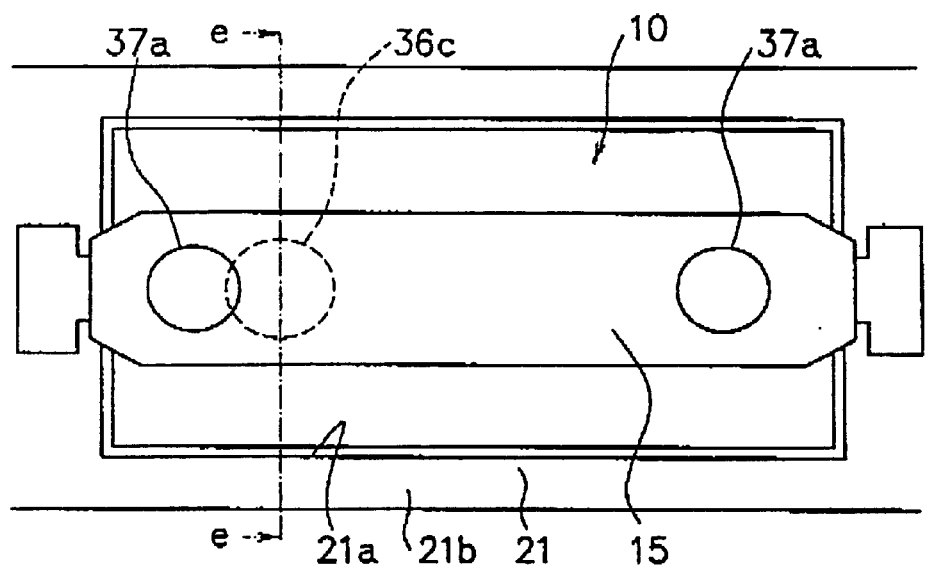
FIG. 20 is a plan view illustrating a terminal-forming frame used in the production process according to the embodiment of the present invention, wherein a resin-molded part is also shown.

That is, as shown in FIG. 20, a terminal-forming frame 21 is formed of a conductive metal material, such as a copper-based material or a copper-based alloy, such that it has a peripheral part 21b, which is much greater in size than the size of the package 11 compared with the peripheral part of the conventional terminal-forming frame. In a space surrounded by the peripheral part 21b, a resin-molded part 15 is formed by molding a packaged electronic component 11 with a molding material.

Figure 21:
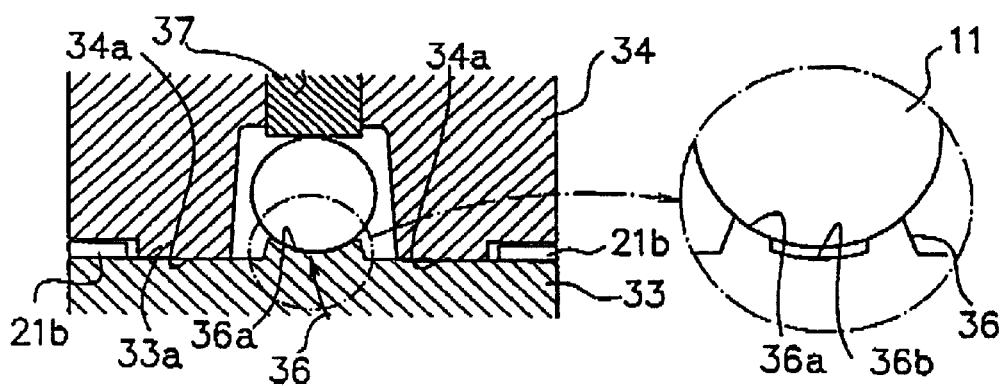
FIG. 21 is a cross-sectional view taken along plane e—e of FIG. 20.

In this process, as shown in FIG. 21, which is a cross-sectional view taken along plane e—e of FIG. 20, the molding is performed in a state in which the peripheral part 21b of the terminal-forming frame 21 is sandwiched between end portions of an upper mold 34 and a lower mold 33.

That is, as shown in FIG. 21, the contact surface 34a of the upper mold 34 and the contact surface 33a of the lower mold 33 are entirely located within the inside of the peripheral part 21b. In other words, the peripheral part 21b of the terminal-forming frame 21 has a space 21a, which is large enough that the contact surface 34a of the upper mold 34, and the contact surfaces 33a and 33a of the lower mold 33 can be entirely located within the space 21a.

Figure 22:
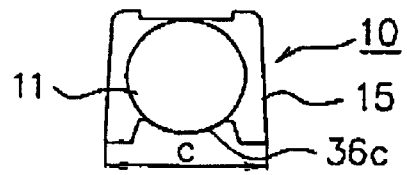
FIG. 22 is a cross-sectional view illustrating a piezoelectric resonator formed via a production process according to an embodiment of the present invention.

Thus, unlike the conventional molded component, a piezoelectric resonator 10 is produced into the form of a molded component without creating burrs on a side face thereof as shown in FIG. 22. In this case, the total external size is determined by "c", and thus the external size can be reduced compared with the conventional product.

Furthermore, instead of the conventional contact part, an electronic component positioning device 36 is formed on the upper surface of the lower mold 33. This positioning device 36 has a positioning mechanism which prevents the package 11 from deviating in a lateral direction shown in FIG. 21. More specifically, for example, the positioning device 36 is obtained by forming a pin-shaped portion protruding from the upper surface of the lower mold 33. The pin-shaped protrusion has a contact surface 36a which is inwardly curved so as to fit with the circumferential side face of the cylindrical package 11. Thus, when the package 11 is held between the eject pin 37 which can move up and down in the upper mold 34 and the positioning means 36, the package 11 is fitted with the inwardly curved contact surface 36a, and thus no deviation in the lateral direction occurs and the obtained molded product does not have a part exposed at a side of the resin-molded part 15.

More preferably, as shown in an enlarged fashion on the right side of FIG. 21, a recess 36b may be formed in a central area of the contact surface 36a of the positioning device 36.

Figure 23:
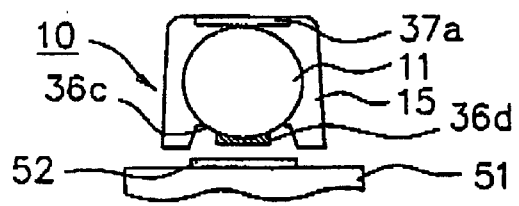
FIG. 23 is a cross-sectional view illustrating another example of a piezoelectric resonator formed via a production process according to an embodiment of the present invention.

In this case, a molding material enters into the recess 36b during the molding process, and thus the lower portion of the piezoelectric resonator 10 is completely covered with molding resin 36d present in the recess 36c, as shown in FIG. 23. This ensures that when the piezoelectric resonator 10 is mounted on a board 51, even if the piezoelectric resonator 10 comes into contact with a conductive pattern 52, good electrical insulation can be achieved.

In the present embodiment, preferably, two ejection pin holes 37a and 37a are formed in the upper surface of the resin-molded part 15, at locations near the respective ends, as shown in FIG. 20. The recess 36c of the positioning device of the lower mold is located at an inner side of the locations of the eject pin holes 37a and 37a.

Thus, during the molding process, the eject pins 37, described above with reference to FIG. 27, are brought into contact with high-strength parts near the ends of the package 11 which is long in one direction, and the cylindrical package 11 is effectively prevented from being deformed. Besides, unlike the conventional molded component, the eject pin 37 and the positioning device 36 are disposed at different locations when viewed in a vertical direction in FIG. 21, and thus it is possible to prevent the force applied to the package 11 by the eject pin 37 and the positioning means 36 from being concentrated upon one point. That is, it is possible to effectively prevent the package 11 from being deformed by the concentrated force.

Figure 24:
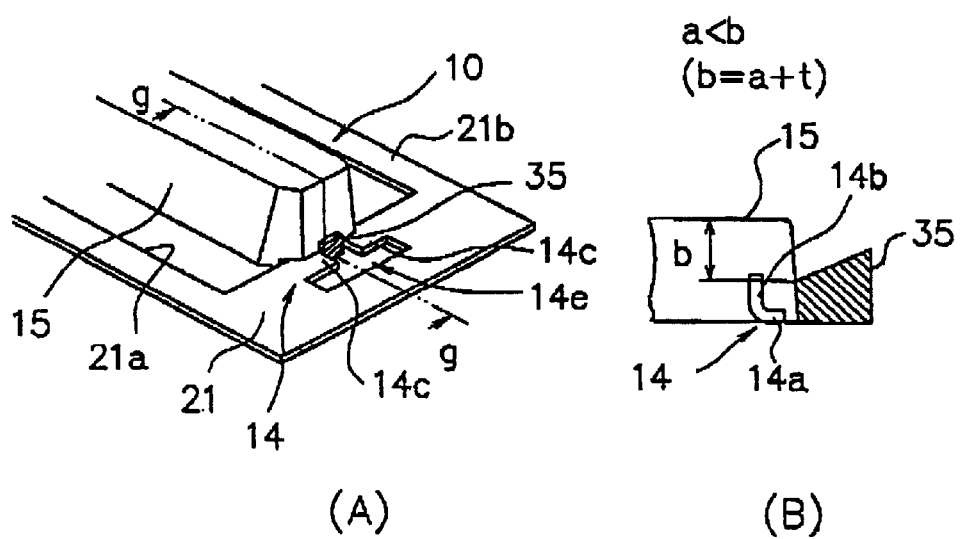

In the present embodiment, as described above with reference to FIG. 14, the lead frame 14 includes the rising-up part 14b disposed on the inner side thereof, and also includes the outwardly extending part 14a, which is formed integrally with the rising-up part 14b, and which is connected to the terminal-forming frame 21. After completion of the resin-molding process, the end parts of the outwardly extending part 14a becomes dummy terminals exposed from the resin-molded part 15. That is, as shown in FIG. 14, the portions 14c and 14c exposed from the resin-molded part 15 are separated from each other by the cutout 14d and they extend outwardly so that they serve as divided dummy terminals. In FIG. 24(A), a gate 35 is formed at a location in an area 14e corresponding to the cutout 14d between the divided dummy terminals 14c and 14c exposed from the molded part 15. The gate 35 is also shown in FIG. 18.

Figure 42:
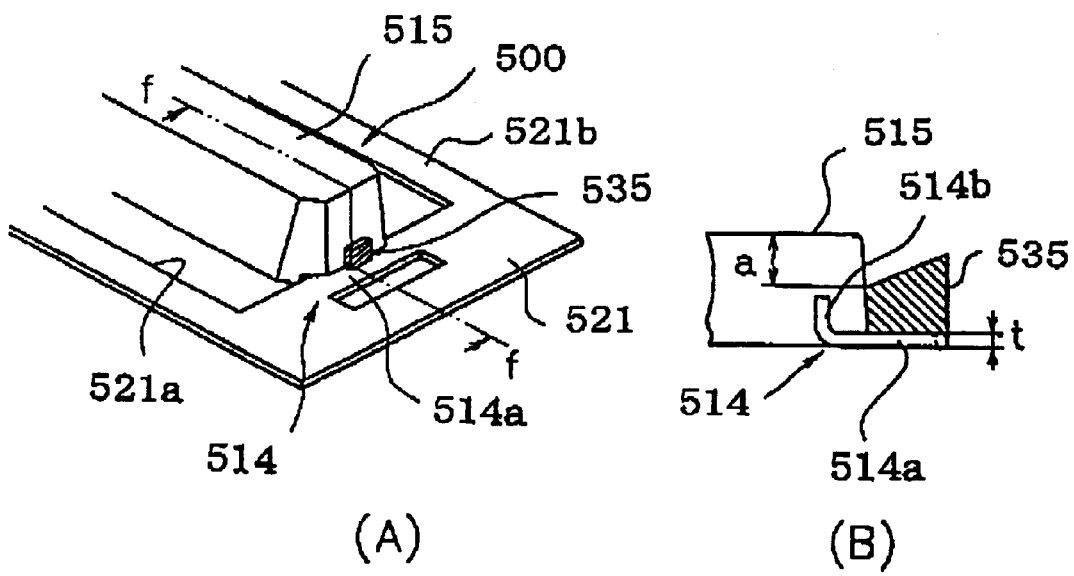

As shown in FIG. 24(B), which is a cross-sectional view taken along plane g—g of FIG. 24(A), because the gate 35 is formed in the area 14e between the divided dummy terminals 14c and 14c, the gate 35 is located at a height lower by the thickness t of the horizontal part 114a than in the case shown in FIG. 42(B), and the thickness b of the upper part above the gate 35 becomes greater by the thickness t of the horizontal part 114a than the thickness a in FIG. 42(B).

As a result, the distance from the top of the gate 35 to the top of the resin-molded part 15 can be large enough to prevent a crack from being created in this upper part of the resin-molded part 15 when the gate is cut off.

Figure 25:
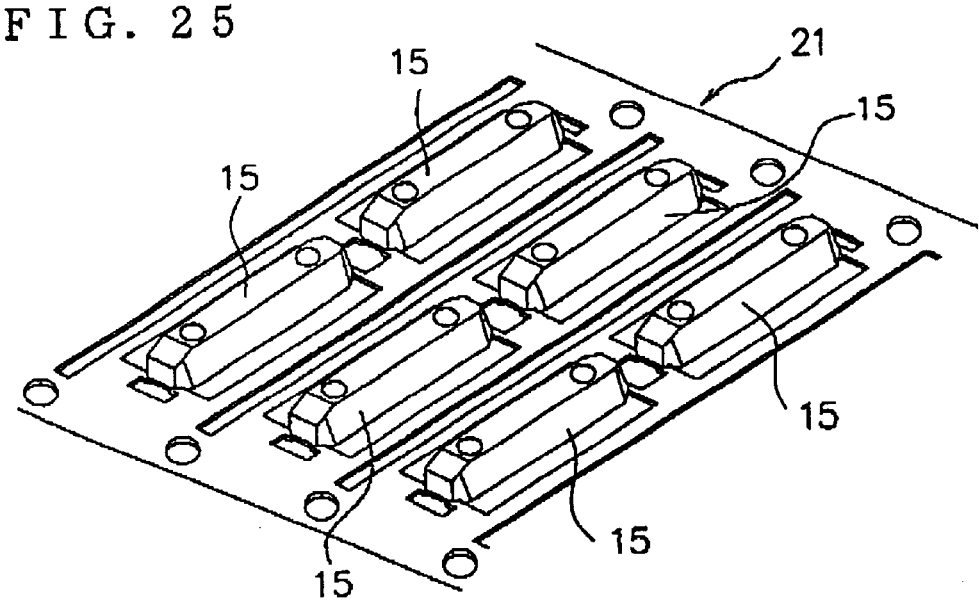
FIG. 25 is a perspective view illustrating a resin-molded component produced via a molding process according to the embodiment of the present invention.

Thus, the molding process is completed in which, as shown in FIG. 25, packages 11 have been covered with the respective resin-molded parts 15 using the terminal-forming frame 21.

Formation of Grooves in the Lead Frame (ST3) and Solder Plating (ST4)

After completion of the molding process, in which the outer leads 12b and 12b are connected to the lead frames 13 and 13 disposed on both ends of the terminal-forming frame 21 and then resin-molding is performed, grooves are formed in the lead frames 13 and 14, via which the electric component in the form of the resin-molded part 15 is connected to the peripheral part 21b of the terminal-forming frame 21.

These grooves are needed mainly to separate the product from the terminal-forming frame 21 in a later step and to enhance the connection strength of the product when mounted on a board.

Figure 26:
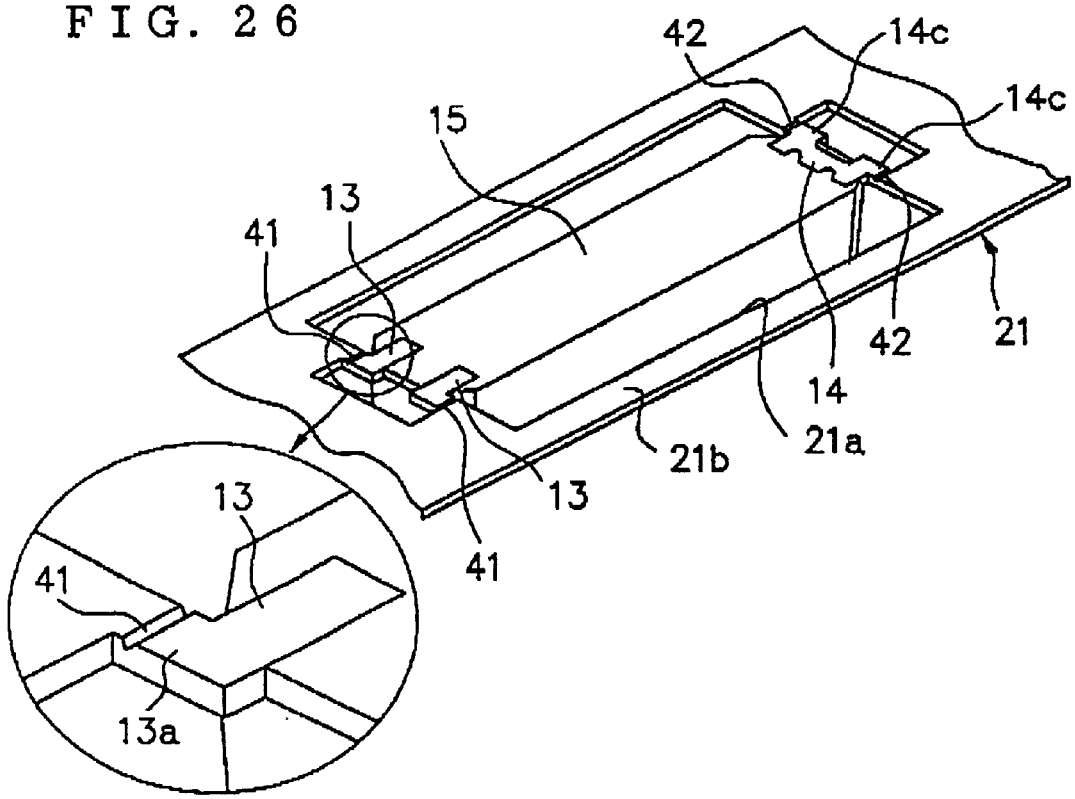
FIG. 26 is a perspective view illustrating a process of forming grooves according to an embodiment of the present invention.

More specifically, grooves are formed as shown in FIG. 26. In FIG. 26, the terminal-forming frame 21 shown in FIG. 25 is placed upside down so that the back surface thereof can be viewed. The resin-molded part 15 formed by covering the package 11 with the molding material is connected to the peripheral part 21b of the terminal-forming frame 21 via the lead frames 13 and 14 disposed on the two respective ends. More specifically, in this specific embodiment, the resin-molded part 15 is connected to the peripheral part 21b via parts 13a and 13a of the lead frames 13 and 13, such that the parts 13a and 13a are exposed from the resin-molded part 15 and extend outwardly in a horizontal direction, and also via the parts 14c and 14c of the lead frame 14, such that the parts 14c and 14c are exposed from the resin-molded part 15 and extend outwardly in a horizontal direction.

Grooves 41, 41, 42, and 42, having a V or U shape, are formed by means of cutting, as shown in an enlarged fashion in FIG. 26, between the peripheral part 21b and the horizontally extending parts 13a, 13a, 14c, and 14c, via which the respective lead frames are connected.

The grooves 41, 41, 42, and 42 may be formed in the previous production step, that is, in the molding process, by employing a lower mold 33 having protrusions corresponding to the grooves 41, 41, 42, and 42. Alternatively, the grooves 41, 41, 42, and 42 may be formed by pressing a die having protrusions corresponding to the grooves 41, 41, 42, and 42, or they may be formed when the lead frames are produced.

After forming the grooves, the lead frames 13 and 14 are plated with solder as will be described below.

FIGS. 27 to 29(B) illustrate one of the problems which occur when a piezoelectric resonator 100 is produced according to a conventional technique without forming such grooves 41, 41, 42, and 42.

Figure 27:
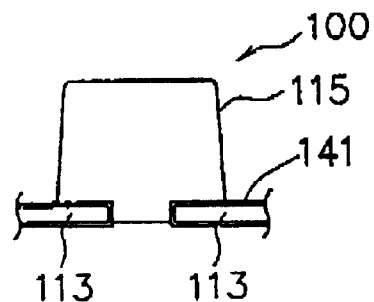
FIG. 27 is a cross-sectional view illustrating a manner in which a lead frame is plated with solder according to a conventional technique.
Figure 28:
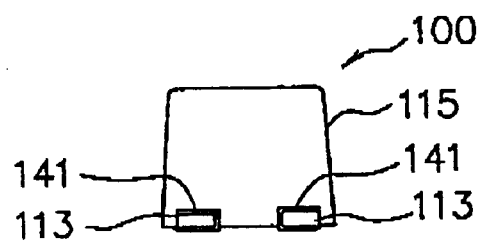
FIG. 28 is a cross-sectional view illustrating a conventional molded component in a state in which lead frames have been cut off.
Figure 29:
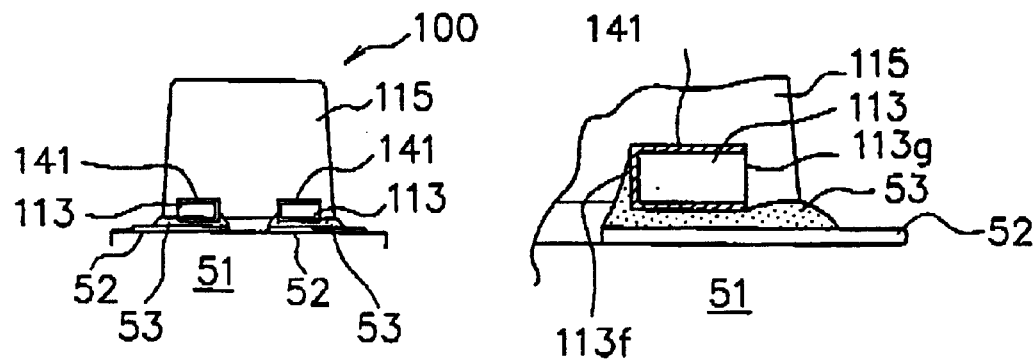

As shown in FIG. 27, in a state in which lead frames 113 and 114 are connected to a terminal-forming frame, the respective read frames are plated with solder 141. Thereafter, as shown in FIG. 28, the lead frames 113 and 114 are cut off so that they are separated from the terminal-forming frame. Thereafter, as shown in FIG. 29(A), solder 53 is applied to a conductive pattern 52 formed on a mounting board 51 and the lead frames 113 serving as the electrode terminals are put thereon and connected thereto. FIG. 29(B) illustrates, in an enlarged fashion, a manner in which the lead frame 113 is connected to the conductive pattern 52.

As shown in FIG. 29(B), the solder 53 is not adhered to an outer side face 113g (on the right side in FIG. 29(B)) of the lead frame 113 but the solder 53 swells up.

That is, because the inner side face 113f (on the left side in FIG. 29(B)) of the lead frame 113 is plated with solder, the inner side face 113f can be wet with solder 53 for connection, and thus the solder 53 is adhered to the side face 113f. However, the solder 53 is not adhered to the outer side face (on the right side in FIG. 29(B)) of the lead frame 113, and thus a reduction in the mounting connection strength occurs.

In an embodiment of the present invention, to avoid the above problem, grooves are formed in the lead frames 13 and 14 after completion of molding so that no problem occurs when products are mounted after separating them.

The above points will be described in further detail below when the mounting process is described. By forming grooves in the lead frames 13 and 14, another advantage is obtained in the process of separating products, as described below.

Separation of Products (ST5)

Figure 30:
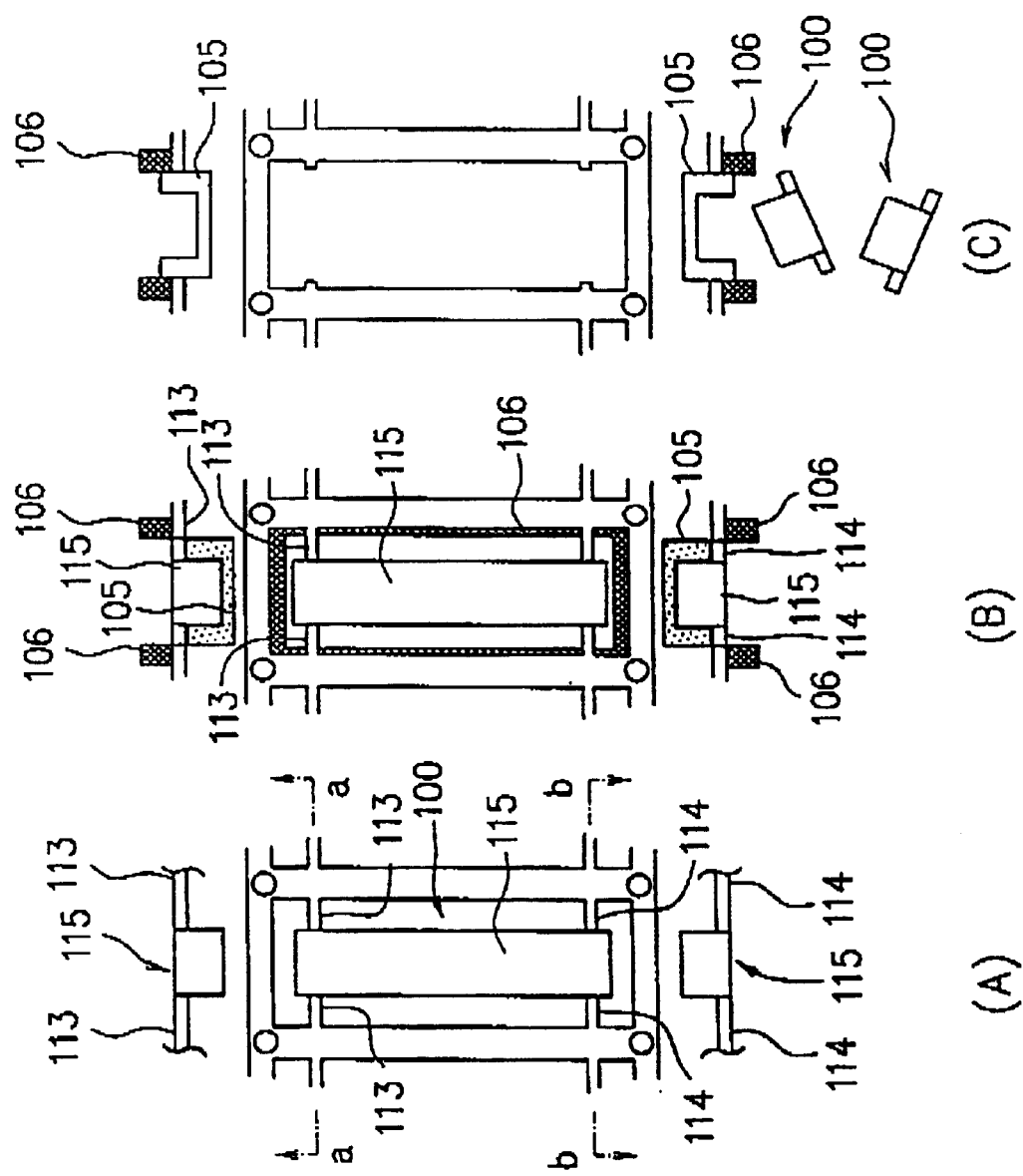
FIGS. 30(A), 30(B) and 30(C) show steps of separating a completed molded component according to a conventional technique.

FIGS. 30(A)–30(C) show a step of cutting a lead frame and separating a product in a process of producing a molded component according to a conventional technique.

FIG. 30(A) illustrates a molded component 100 before being separated, wherein a plan view is shown in the middle, a cross-sectional view taken along plane a—a is shown at the top, and a cross-sectional view taken along plane b—b is shown at the bottom.

In FIGS. 30(A)–30(B), the molded component 100 is, for example, a piezoelectric resonator, which has been produced by placing a quartz resonator chip or the like into a cylindrical package (not shown), and connecting electrode terminals thereof to lead frames 113 and 113, and then molding the package with a molding material, such as a synthetic resin, using a particular mold thereby forming a resin-molded part 115.

In this state, as shown in FIG. 30(B), a die 106, in the form of a frame, is placed under the lead frames 113, 113, 114, and 114, and the lead frames 113, 113, 114, and 114 are fixed on the die 106. Thereafter, a pressing device 105, smaller than the inner size of the die 106, is brought into contact with the resin-molded part 115, and the resin-molded part 15 is pushed into the die 106, thereby cutting off all the lead frames 113, 113, 114, and 114 by tearing off, and thus separating the molded component 100 as shown in FIG. 30(C).

However, in this separation method, a crack is sometimes created in the molding material of the resin-molded part 115 formed in the previous production step. Furthermore, in the cutting process shown in FIG. 30(B), a mechanical shock can cause degradation in hermeticity of the package in the resin-molded part 115. This can result in an increase in CI (crystal impedance) value of a quartz resonator chip (not shown), and thus can cause the oscillation of the quartz resonator chip to cease.

In an embodiment of the present invention, to avoid the above problem, separation of products is performed in the following manner.

FIGS. 31(A)–(D) show a step of cutting a lead frame and separating a product in a process of producing a molded component according to the present embodiment. Although the details of the structure of the lead frames 13 and 14 are drawn differently from those shown in the other figures because of limitation in drawing the figure, the actual structure is the same as those shown in the other figures.

Figure 31:
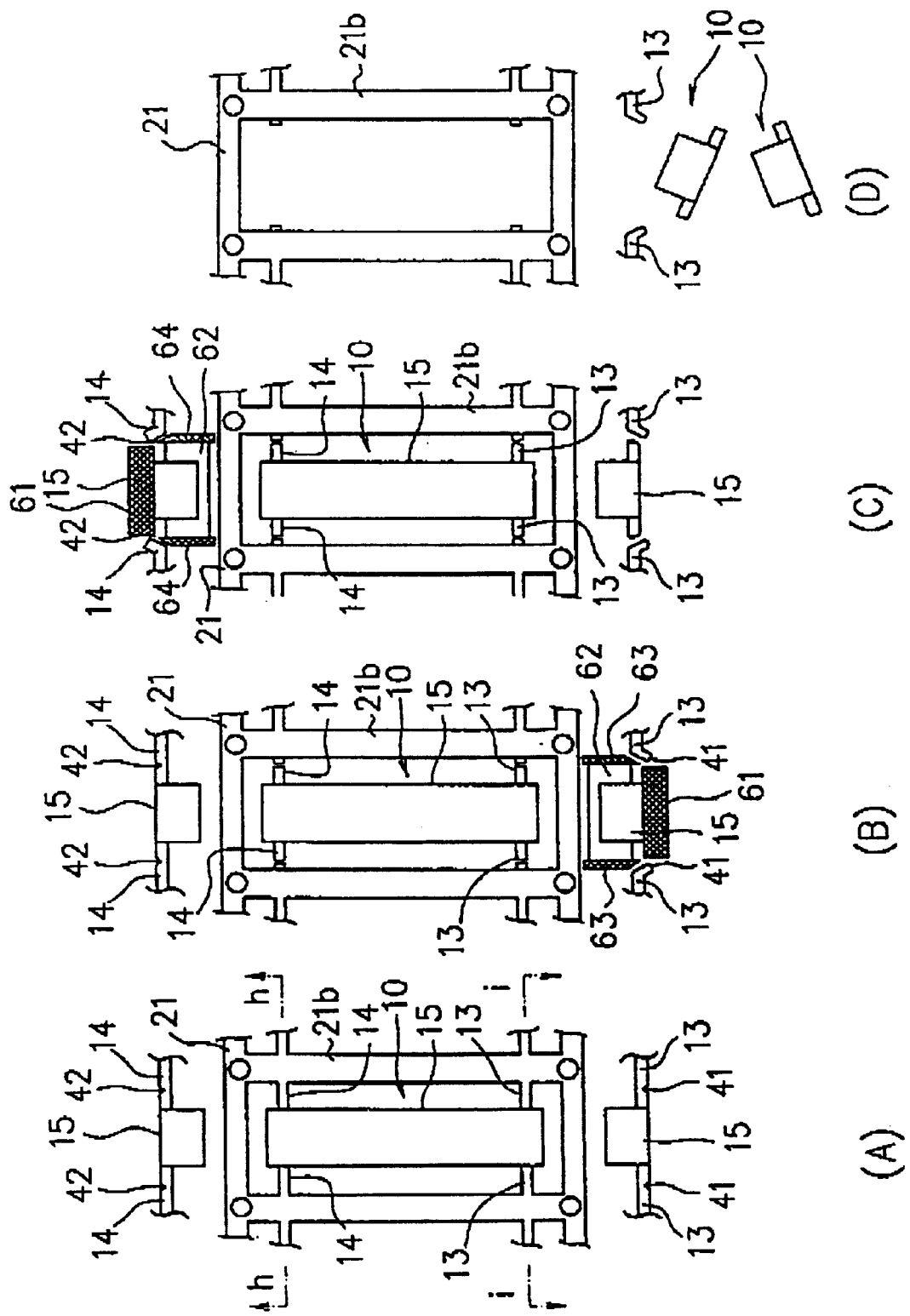
FIGS. 31(A), 31(B), 31(C) and 31(D) show steps of separating a completed molded component according to an embodiment of the present invention.

FIG. 31(A) illustrates a piezoelectric resonator 10 in the form of a molded component in a state in which is has not been separated yet, wherein a plan view is shown in the middle, a cross-sectional view taken along line h—h is shown at the top, and a cross-sectional view taken along plane i—i is shown at the bottom. Note that FIGS. 31(A) to 31(D) are drawn in a similar manner.

In FIG. 31(A), the piezoelectric resonator 10 subjected to the molding process is held by a peripheral part 21b of a terminal-forming frame 21, via lead frames 13, 13, 14, and 14. Grooves 41 and 42 are formed in the lead frames 13, 13, 14, and 14 as described above. In this embodiment, the solder plating of the lead frames is performed after forming the grooves.

In this state, as shown in FIG. 31(B), a first cutting step is performed to cut off lead frames 13 and 13 located on one side.

In this first cutting step, a base 61 is first placed under the resin-molded part 15, as shown at the bottom of FIG. 31(B). The base 61 has a size greater than the external size of the resin-molded part 15 and has a flat upper surface. As shown in FIG. 31(B), the width of the base 61 is selected such that the edges thereof substantially correspond to the locations of the grooves 41 and 41 of the lead frames 13 and 13.

Thereafter, an ejection device 62 placed above the resin-molded part 15 is moved down. The ejection device 62 is capable of moving up and down in a direction across the thickness of the terminal-forming frame 21, and has a shape which allows the ejection device 62 to accept the resin-molded part 15 from above. After the lead frames are cut off, the downward movement of the ejection device 62 causes the piezoelectric resonator 10 in the form of the molded component to fall down. As shown in FIG. 31(B), the width of the ejection means 62 is selected such that the edges thereof substantially correspond to the locations of the grooves 41 and 41 of the lead frames 13 and 13.

A pair of cutting blades 63 and 63, serving as first cutting blades, are disposed on outer side faces of the ejection means 62. The first cutting blades are capable of moving in the same direction as the direction in which the ejection means 62 moves, synchronously or not synchronously with the operation of the ejection device 62. The pair of cutting blades 63 and 63, serving as the first cutting blades, are set such that the cutting edges correspond to the locations of the grooves 41 and 41 of the lead frames 13 and 13. In the first cutting step, the ejection device 62 is brought from above into contact with the resin-molded part 15 held on the base 61, and the pair of cutting blades 63 and 63 serving as the first cutting blades is slid downward along the side faces of the ejection device 62. As a result, the lead frames 13 and 13 are cut off at the grooves 41 and 41 by the pair of cutting blades 63 and 63, serving as the first cutting blades, brought into contact with the lead frames 13 and 13 from the side opposite to the side where grooves are formed.

In this first cutting step, unlike the conventional technique in which the separation is performed by a device to tear off, separation is performed by a device to cut using the cutting blades, and thus a less mechanical shock is imposed during the cutting step. Furthermore, because the lead frames 13 and 13 are cut along the grooves 41 and 41, the cutting area becomes smaller than in the conventional cutting process, and thus the mechanical shock during the cutting process is reduced.

Thereafter, a second cutting step is performed. That is, as shown in FIG. 31(C), the ejection device 62 is moved downward from above toward the resin-molded part 15, and the resin-molded part 15 is held on the base 61 by the ejection means 62. A pair of cutting blades 64 and 64, serving as second cutting blades, are disposed on outer side faces of the ejection device 62. The second cutting blades are capable of moving in the same direction as the direction in which the ejection means 62 moves, synchronously or not synchronously with the operation of the ejection device 62. The pair of blades 64 and 64, serving as the second cutting blades, are set such that the cutting edges correspond to the locations of the grooves 42 and 42 of the lead frames 14 and 14.

In this second cutting step, the ejection device 62 is brought from above into contact with the resin-molded part 15 held on the base 61, and the pair of cutting blades 64 and 64, serving as the second cutting blades, are slid downward along the side faces of the ejection device 62. As a result, the lead frames 14 and 14 are cut off at the grooves 42 and 42 by the pair of cutting blades 64 and 64, serving as the second cutting blades, brought into contact with the lead frames 14 and 14 from the side opposite to the side where grooves are formed.

Also in this second cutting step, as in the first cutting step, the mechanical shock imposed during the cutting process is much smaller than that imposed in the conventional cutting process.

Figure 32:
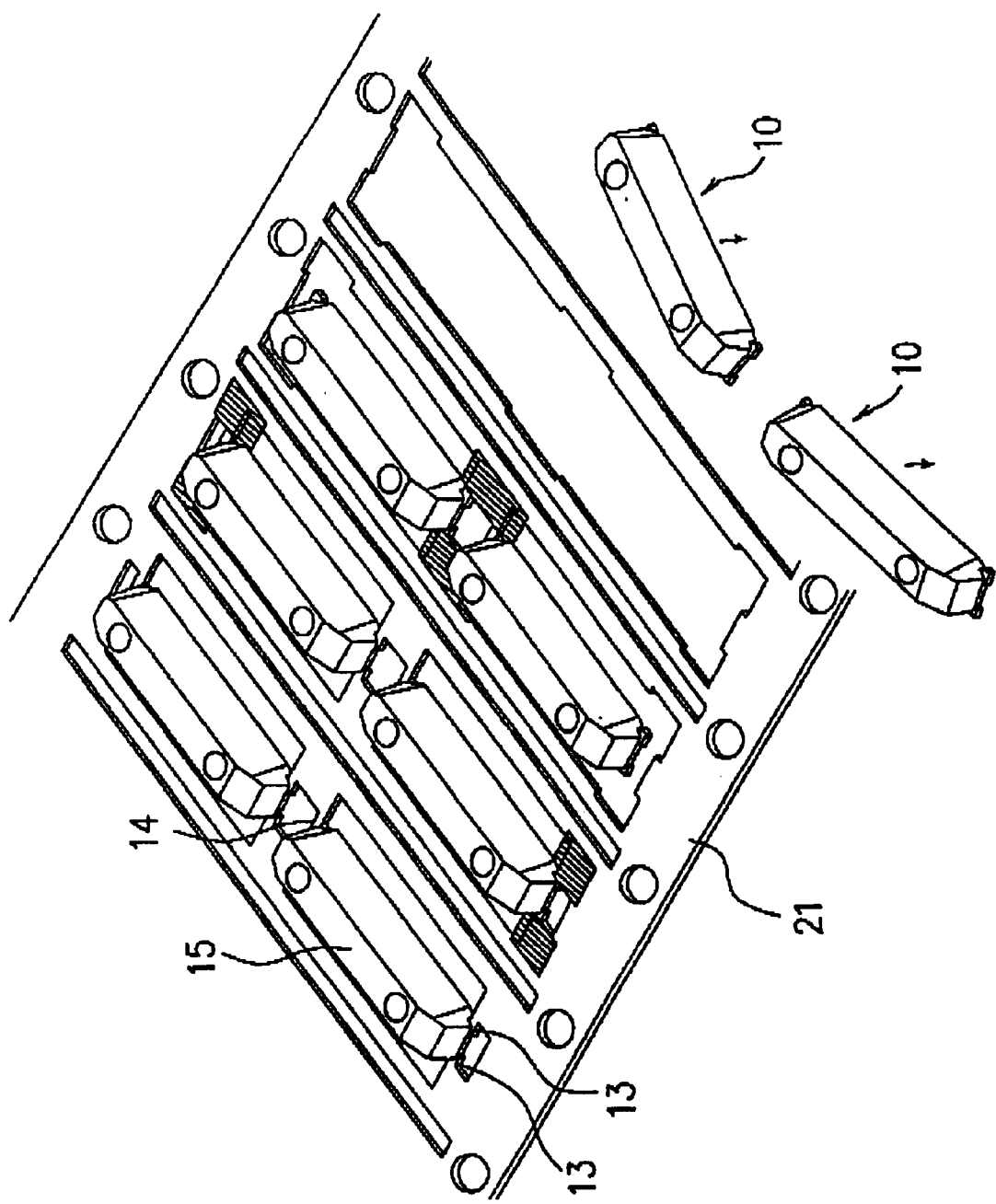
FIG. 32 is a perspective view illustrating a manner in which completed products are separated according to the embodiment of the present invention.

Thus, as shown in FIG. 31(D), when the lead frames 14 and 14 are cut off in the second cutting step, the resin-molded part 15 is pushed down against the base 61 by the ejection device 62, and thus, if the base 61 is removed, the piezoelectric resonators 10 are separated and fall down as shown in FIG. 32.

In FIG. 32, in the leftmost line, lead frames have not been cut off yet, and lead frames, shaded with lines in the second line counted from the left end, are cut off. In the third line counted from the left end, lead frames, shaded with lines, are cut off. In the fourth line counted from the left end, that is in the rightmost line, piezoelectric resonators 10 and 10 are separated and dropped down.

In the product separation step (ST5) according to the present embodiment, as described above, because the lead frames 13 and 14 are cut off at the grooves 41 and 42 using the cutting blades through a plurality of cutting steps (two cutting steps in this specific embodiment), the mechanical shock imposed during the cutting process is greatly reduced compared with the conventional cutting process, and thus the mechanical shock imposed upon the products is greatly reduced. The number of cutting steps is not limited to two, and the cutting off may be performed through a greater number of cutting steps as required.

In addition, the grooves 41 and 42 formed in the respective lead frames 13 and 14 provide advantageous effects in the following mounting step as described below.

Mounting (ST6)

Figure 33:
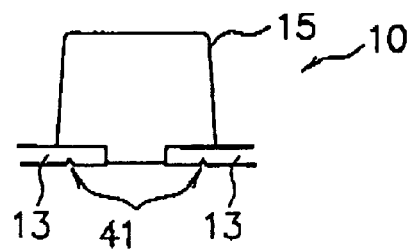
FIG. 33 is a cross-sectional view illustrating a manner in which grooves are formed in lead frames according to an embodiment of the present invention.
Figure 34:
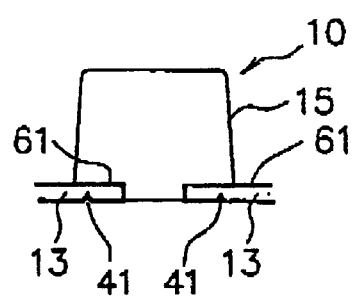
FIG. 34 is a cross-sectional view illustrating a manner in which lead frames are plated with solder according to an embodiment of the present invention.

FIGS. 33 and 34 illustrate production steps performed before a mounting step. That is, in FIG. 33, as described earlier, grooves are formed in the lead frames 13 and 14 in a state in which the lead frames 13 and 14 are connected to the terminal-forming frame 21 (FIG. 26).

Thereafter, as shown in FIG. 34, the respective lead frames are plated with solder 61.

Figure 35:
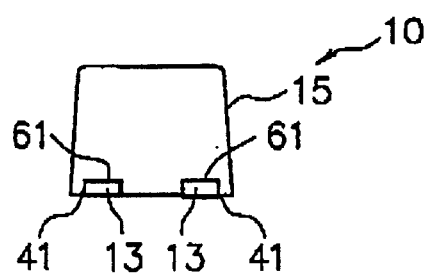
FIG. 35 is a cross-sectional view illustrating a molded component in a state in which lead frames have been cut off, according to an embodiment of the present invention.
Figure 36:
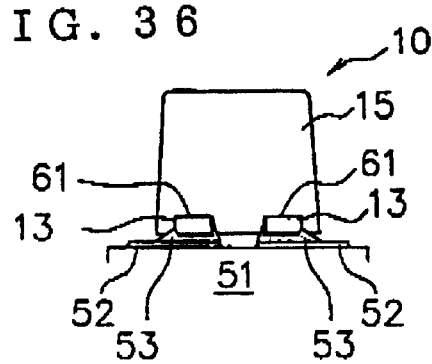
Figure 36:
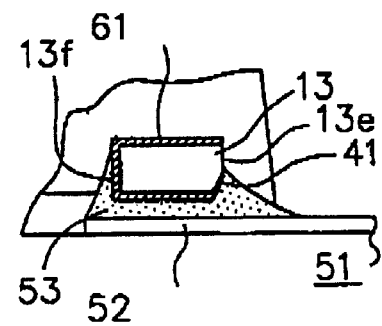

After that, as shown in FIG. 35, the lead frames 13 and 14 are cut off and separated from the terminal-forming frame 21 in the production separation process described above (FIG. 32). Thereafter, as shown in FIG. 36(A), solder 53 is applied to a conductive pattern 42 formed on a mounting board 51 and the lead frame 13 serving as the electrode terminal is placed on the conductive pattern 52 so as to connect the lead frame 13 thereto. FIG. 36(B) is an enlarged view illustrating portions associated with the mounting connection.

As shown in FIG. 36(B), solder 53 for connection is adhered not only to the lower surface of the lead frame 13 but also to the inner side face 13f (on the left side) plated with solder 61, because the solder-plated surface provides good wettability. Furthermore, in the lead frame 13, as shown in FIG. 36(B), unlike the lead frame having the conventional structure, a groove 41 is formed on the outer side face 13e (on the right side), near a lower edge. Because the grooved portion 41 is also plated with solder 61, the grooved portion 41 can also be wet with the solder 53, and thus the solder 53 for connection is adhered thereto as shown in FIG. 36(B).

Thus, unlike the conventional technique, solder 53 is also adhered to the outer side face 13e (on the right side) of the lead frame 13 when mounting is performed, and thus the mounting connection strength is enhanced, and an electrical connection is made in a more reliable fashion.

The method of producing a molded component according to the present invention has been described above with reference to particular embodiments. Now, additional advantages associated with the structure of the piezoelectric resonator 10 in the form of a molded component described earlier with reference to FIGS. 1 and 4 are described above.

Figure 37:
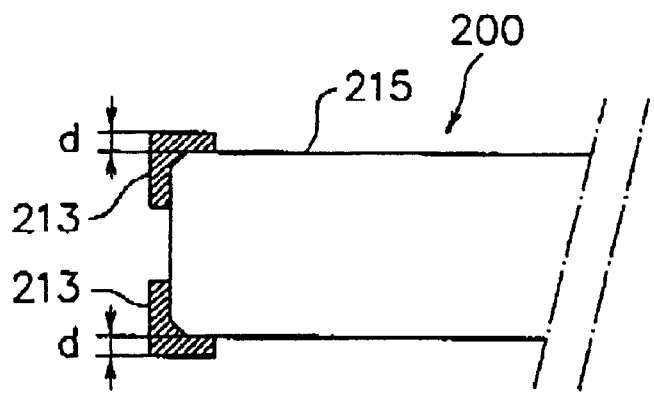
FIG. 37 is a fragmentary plan view illustrating the relationship between electrode terminals and the shape of an end portion of a conventional molded component.
Figure 38:
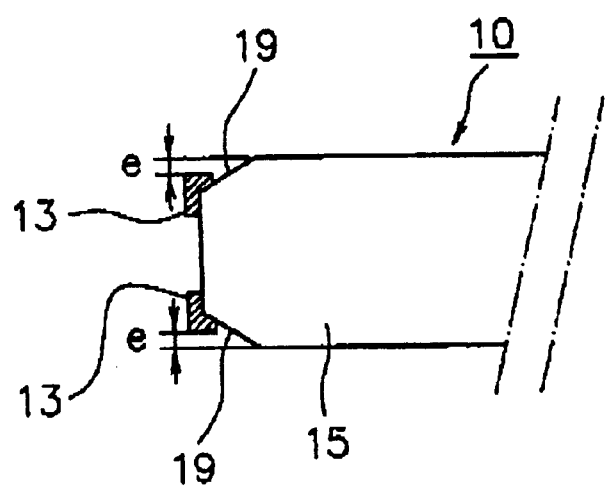
FIG. 38 is a fragmentary plan view illustrating the relationship between electrode terminals and the shape of an end portion of a molded component according to an embodiment of the present invention.
Figure 39:
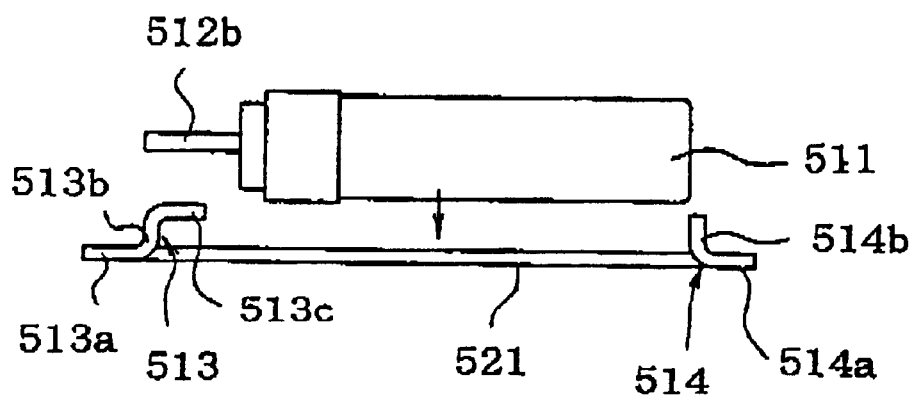
FIG. 39 is a side view illustrating a manner in which a package is inserted between lead frames located at two respective ends, according to an embodiment of the present invention.

FIG. 38 illustrates a left end portion of the piezoelectric resonator 10 shown in FIG. 1, and corresponding parts of a conventional piezoelectric resonator 200 is shown in the form of a plan view in FIG. 37. In the conventional piezoelectric resonator 200, as shown in FIG. 37, corners of the resin-molded part 215 are formed so as to have an angle substantially equal to 90°, and the electrode terminals 213 and 213 are exposed both in a direction across the width of the resin-molded part 215 and in a direction along the length thereof, because the electrode terminals 213 and 213 are needed to be exposed from the resin-molded part 215 to them to a mounting board. In particular, because the electrode terminals are formed so as to have a shape corresponding to lands which are formed on the board and which generally have a square shape, the electrode terminals extend outwardly in a direction parallel to the width of the resin-molded part 15 beyond a corresponding edge thereof by a distance d. As a result, the connection pattern formed on the board has a size greater than the product (resin-molded part 215).

In contrast, in the structure according to an embodiment of the present invention, as shown in FIG. 38, the corners of the resin-molded part 15 are formed so as to have tapered diagonal surfaces 19 and 19, and the electrode terminals 13 and 13 are exposed from the corresponding diagonal surfaces. Corners and electrode terminals are also formed in a similar manner on the opposite end where the lead frame 14 is disposed, although they are not shown.

Because the electrode terminals are exposed from the corresponding diagonal surfaces 19 and 19 which are inclined inwardly toward the end of the resin-molded part 15, it becomes possible to expose electrodes with square areas within an area having a width smaller than the width of the resin-molded part 15, and the edge of each electrode terminal 13 can be withdrawn from the corresponding edge of the resin-molded part 15 by a distance of e. Therefore, in the case where the product (resin-molded part 15) has the same size as that of the conventional product, the connection patterns can be formed on the board with a corresponding reduced pitch, and thus it is possible to reduce the mounting area.

The present invention is not limited to the particular embodiments described above.

Furthermore, the present invention is not limited to the piezoelectric resonator, and instead the present invention may be applied to various types of molded components obtained by molding electronic components.

For example, the order in which the production steps are performed may be changed. Furthermore, the conditions and the structures described above with reference to the specific embodiments may be partially omitted, modified, or combined in a different manner.

As described above, an aspect of the present invention provides a molded component and a method of producing the same, in which an electronic component is precisely positioned with respect to a terminal-forming lead frame, thereby ensuring that an electrical connection is made in a highly reliable fashion, and the electronic component is properly molded with resin.

Another aspect of the present invention provides a method of producing a molded component, in which an electronic component is precisely positioned with respect to a terminal-forming lead frame, thereby ensuring that an electrically connection is made in a highly reliable fashion, and the mounting connection strength is enhanced, because no burrs are formed on a surface, which is to be contacted with a surface of a board, of the resultant molded component.

Another aspect of the present invention provides a molded component and a method of producing the same, in which a crack is prevented from being created when a gate is cut off after producing a resin-molded part using a molding material.

Another aspect of the present invention provides a resin-molded structure of a molded component and a method of producing the same, in which no burrs are created on a side face during the step of molding an electronic component, having a shape which is long in one direction, with a molding material, and thus a small resin-molded structure can be realized.

Industrial Applicability

As described above, the present invention can be applied to molded components obtained by molding an electronic component with resin and methods of producing such a molded component.

What is claimed is:

1. A molded component obtained by inserting an electronic component between lead frames disposed at two respective ends of the electronic component, and then molding said electronic component with resin, comprising:
    a lead frame, disposed on one end of the electronic component, that serves as an electrode terminal exposed from a resin-molded part; and
    another lead frame disposed on another end of the electronic component that serves as a dummy terminal, said dummy terminal including:
    a horizontal part having an inner end and an end portion exposed to an exterior of the molded component and extending horizontally from said resin-molded part; and
    a rising-up part which is formed integrally with said horizontal part and which rises up from the inner end of said horizontal part, the angle between said rising-up part and said horizontal part being slightly smaller than 90°.

2. A method of producing a molded component obtained by inserting an electronic component between lead frames disposed at two respective ends of the electronic component, and then molding said electronic component with resin, the method comprising:
    connecting a lead terminal to an electrode terminal by bringing the lead terminal of the electronic component into contact with at least one lead frame of lead frames disposed on the two respective ends of the electronic component, and then applying a voltage thereto so as to connect said lead terminal to said electrode terminal, said connection step including the steps of:
    positioning said lead frame with respect to an electrode block that supplies said voltage; and
    an electronic component holding device, having a contact surface which fits with the external shape of said electronic component, formed on said electrode block, bringing said electronic component into contact with said electronic component holding device, thereby correctly positioning the lead terminal of said electronic component with respect to said at least one of lead frames disposed on the two respective ends.

3. A method of producing a molded component obtained by inserting an electronic component between lead frames disposed at two respective ends of the electronic component, and then molding said electronic component with resin, the method comprising:
    molding said electronic component with resin after connecting a lead terminal to an electrode terminal by bringing the lead terminal of the electronic component into contact with at least one lead frame of lead frames disposed on the two respective ends of the electronic component, and then applying a voltage thereto so as to connect said lead terminal to said electrode terminal,
    a positioning device, having a contact surface which fits with the external shape of said electronic component, being disposed in a mold used in said molding step, molding being performed while maintaining said positioning device in contact with said electronic component.

4. The method of producing a molded component according to claim 3, said positioning device including a recessed part formed in the contact surface which fits with said electronic component, and the molding step being performed such that said recessed part is filled with said molding material.

5. A method of producing a molded component obtained by inserting an electronic component between lead frames disposed at two respective ends of the electronic component, and then molding said electronic component with resin, a lead frame, disposed on one of the two ends of the electronic component, including an outwardly extending part, a rising-up part which rises up from the inner end of said outwardly extending part, and a lead terminal connection part extending inwardly from the end of said rising-up part, said method including the steps of:
    before molding said electronic component with resin, disposing said lead frame on one end of the electronic component such that the lead terminal connection part thereof is slightly inclined downwardly in an inward direction;
    thereafter, bringing an electrode that applies a welding voltage into contact with said lead terminal connection part from below;
    thereafter, placing a lead terminal of said electronic component upon said lead terminal connection part; and
    thereafter, connecting said lead terminal to said lead terminal connection part.

6. The method of producing a molded component according to claim 5, a lead frame disposed on the other one of the two ends of said electronic component including an end part extending outwardly and a rising-up part which is formed integrally with said outwardly extending part and which rises up from the inner end of said outwardly extending part, further comprising:

before molding said electronic component with resin, disposing said lead frame such that said outwardly extending part is slightly inclined downwardly in an inward direction.

7. The method of producing a molded component according to claim 5, further comprising:

forming a groove in a surface, which is to be used as a contact surface when said molded component is mounted, of said lead frame disposed on one of the two ends of the electronic component; and plating said lead frame including the grooved part with solder.

8. A molded component obtained by inserting an electronic component between lead frames disposed at two respective ends of the electronic component, and then molding said electronic component with resin, comprising:

a lead frame disposed on one end of the electronic component that serves as an electrode terminal exposed from a resin-molded part; and another lead frame disposed on the other end of the electronic component that serves as a dummy terminal, said dummy terminal including:

a horizontal part having an end portion exposed to an exterior of the molded component and extending horizontally from a part near a lower edge of said resin-molded part, at least a part, exposed to the exterior from said resin-molded part, of said horizontal part being divided into two portions along a horizontal direction.

9. A method of producing a molded component obtained by inserting an electronic component between lead frames disposed at two respective ends of the electronic component, and then molding said electronic component with resin, said method comprising:

disposing a lead frame on one end of the electronic component that serves as an electrode terminal exposed from a resin-molded part; and disposing another lead frame on the other end of the electronic component that serves as a dummy terminal, said dummy terminal including:

a horizontal part having an end portion exposed to an exterior of the electronic component and extending horizontally from a part near a lower edge of said resin-molded part, at least a part, exposed to the exterior from said resin-molded part, of said horizontal part being divided into two portions along a horizontal direction; and forming a gate, that passes a molding material, in a region between said two divided portions of said dummy terminal.

* * * * *